United States Patent
Ogihara et al.

(10) Patent No.: US 8,415,680 B2
(45) Date of Patent: Apr. 9, 2013

(54) SEMICONDUCTOR COMPOSITE APPARATUS, PRINT HEAD, AND IMAGE FORMING APPARATUS

(75) Inventors: Mitsuhiko Ogihara, Hachioji (JP); Hiroyuki Fujiwara, Hachioji (JP); Masataka Muto, Hachioji (JP); Takahito Suzuki, Hachioji (JP); Tomoki Igari, Hachioji (JP)

(73) Assignee: Oki Data Corporation, Tokyo (JP)

( * ) Notice: Subject to any disclaimer, the term of this patent is extended or adjusted under 35 U.S.C. 154(b) by 336 days.

(21) Appl. No.: 11/385,699

(22) Filed: Mar. 22, 2006

(65) Prior Publication Data

US 2006/0214287 A1   Sep. 28, 2006

(30) Foreign Application Priority Data

Mar. 25, 2005   (JP) ................... 2005-089353

(51) Int. Cl.
*H01L 31/12* (2006.01)

(52) U.S. Cl. ........... 257/79; 257/84; 257/85; 257/98

(58) Field of Classification Search ........ 257/98, 257/79, 84, 85
See application file for complete search history.

(56) References Cited

U.S. PATENT DOCUMENTS

| 6,097,453 | A * | 8/2000 | Okita .............. 349/43 |
| 6,504,180 | B1 | 1/2003 | Heremans et al. |
| 6,641,933 | B1 * | 11/2003 | Yamazaki et al. ...... 428/690 |
| 7,327,018 | B2 * | 2/2008 | Chung ............... 257/678 |
| 2003/0209722 | A1 | 11/2003 | Hatakoshi et al. |
| 2004/0012037 | A1 | 1/2004 | Venkatesan et al. |
| 2004/0094770 | A1 * | 5/2004 | Ogihara et al. ....... 257/79 |
| 2005/0057641 | A1 | 3/2005 | Ogihara et al. |
| 2006/0187154 | A1 * | 8/2006 | Tsuchida ............ 345/76 |

FOREIGN PATENT DOCUMENTS

| CN | 1501493 | 6/2004 |
| EP | 0319907 A2 | 6/1989 |
| EP | 1434269 A2 | 6/2004 |
| EP | 1515367 A2 | 3/2005 |
| JP | 6-334168 A | 12/1994 |
| JP | 10-63807 | 3/1998 |
| JP | 2001-063138 | 3/2001 |
| JP | 2005-93649 | 4/2005 |
| JP | 2005-222074 A | 8/2005 |
| WO | WO 2004077893 A1 * | 9/2004 |

OTHER PUBLICATIONS

"Design of Light Printer" pp. 114-116 (under editorship of Mukita Yoshihiro, published by TRICEPS).

* cited by examiner

*Primary Examiner* — Howard Weiss
*Assistant Examiner* — Tifney Skyles
(74) *Attorney, Agent, or Firm* — Rabin & Berdo, P.C.

(57) ABSTRACT

A semiconductor composite apparatus, includes a first substrate, a semiconductor thin film layer, active devices, first driving circuits, and second driving circuits. The semiconductor thin film layer is formed on the first substrate and is formed of a first semiconductor material. The active devices are formed in the semiconductor thin film layer. The first driving circuits is formed of a second semiconductor material and performing a first function in which the active devices are driven. The second driving circuits are formed of a third semiconductor material and performing a second function in which the active devices are driven, the second function being different from the first function.

4 Claims, 33 Drawing Sheets

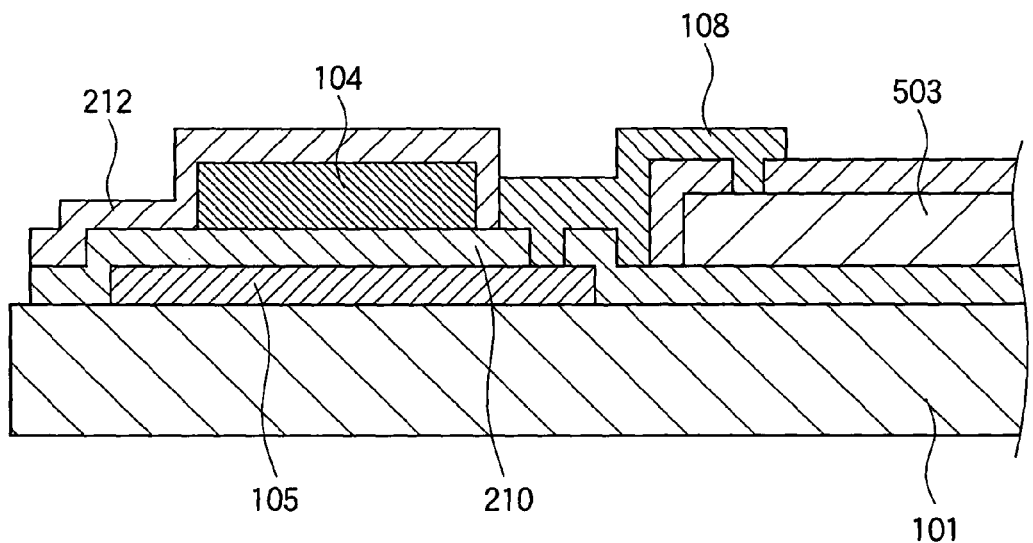
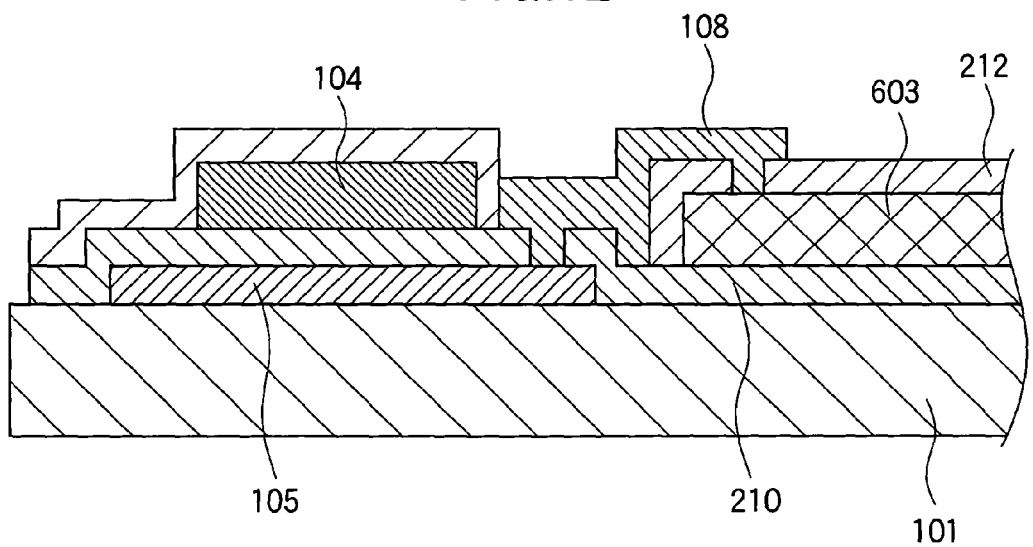

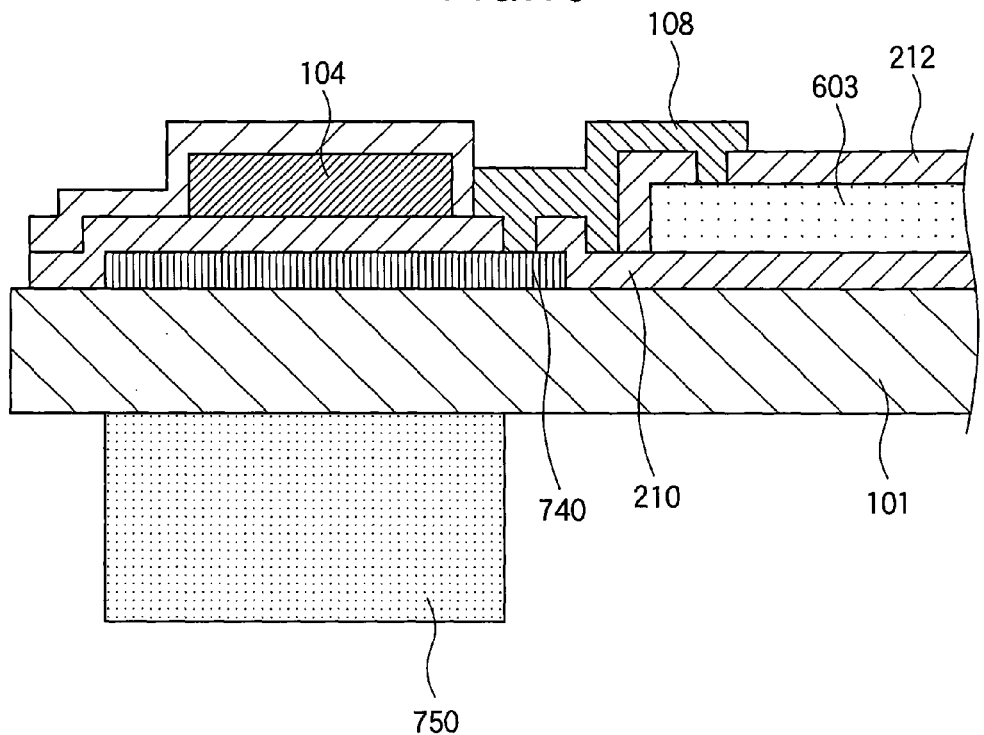
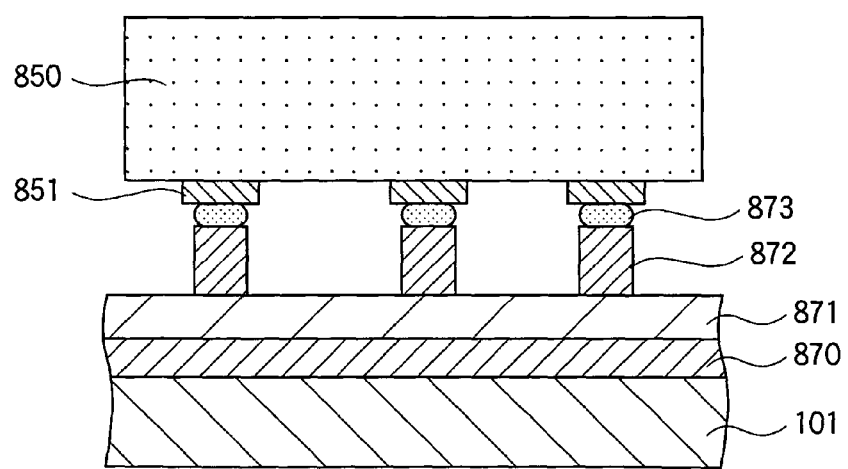

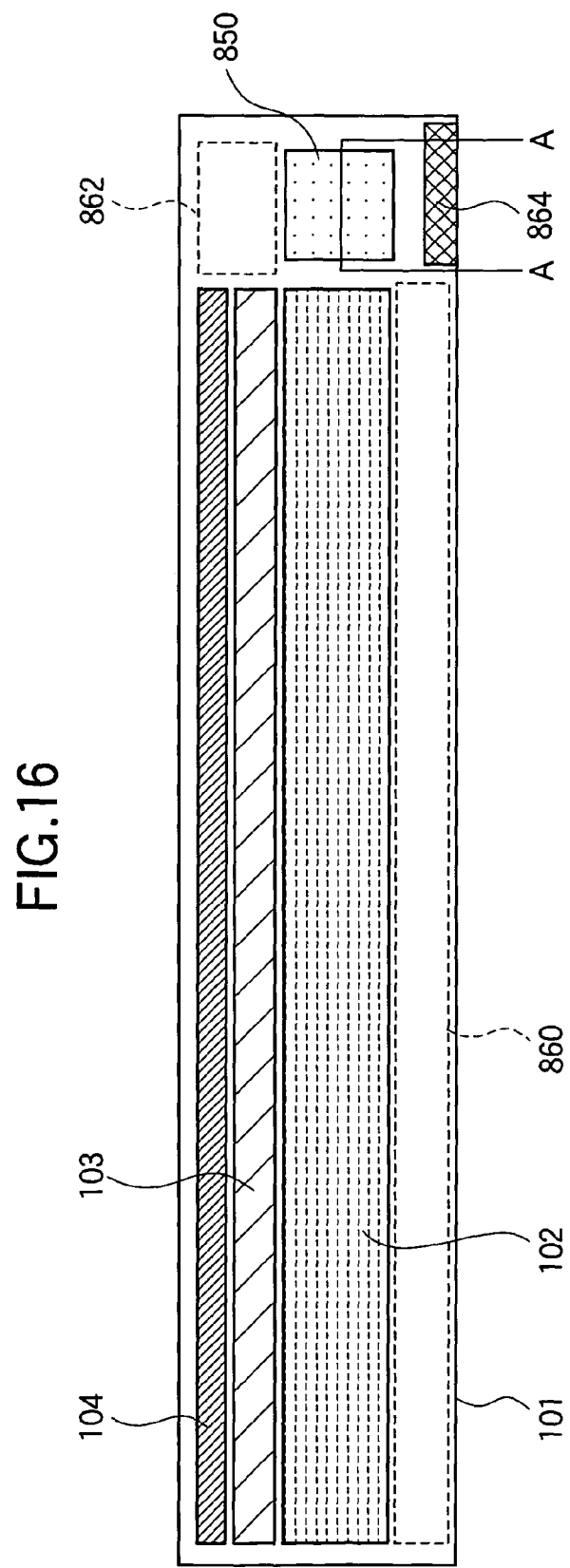

SEMICONDUCTOR COMPOSITE APPARATUS, PRINT HEAD, AND IMAGE FORMING APPARATUS

BACKGROUND OF THE INVENTION

1. Field of the Invention

The present invention relates to a semiconductor composite apparatus such as a light emitting diode (LED), a print head that uses such a semiconductor composite apparatus, and an image forming apparatus.

2. Description of the Related Art

For example, Japanese Patent (Kokai) Publication No. 10-63807 discloses a conventional semiconductor composite apparatus in which light emitting elements and their driver circuits and semiconductor integrated circuits are fabricated. This semiconductor composite apparatus is a card type information-controlling apparatus that includes light-emitting/light-receiving elements and associated electronics on a substrate. The light-emitting/light-receiving elements are formed of semiconductor thin films, and convert electrical signals into light signals and light signals into electrical signals. The electronics includes semiconductor integrated circuit elements, capacitors, and inductors, and communicates display information with the light-emitting/light-receiving elements.

Among recent optical printheads used as a light source for an electrophotographic printer is a semiconductor composite apparatus ("Design of Light Printer" pp 114-116 (under editorship of Mukita Yoshihiro, published by TRICEPS). Light emitting diode (LED) array chips and their drive circuit chips are mounted on a printed circuit board.

The above reference "Design of a Light Printer" discloses a conventional LED unit that employs light emitting diodes (LEDs) The LED unit includes a plurality of LED chips in which a plurality of LEDs are arranged, driving integrated circuits (driving ICs) that drive the LED chips, and a unit substrate on which the LED chips and driving ICs are mounted. The LED chips are electrically connected to the driving ICs by wire bonding. The LED chips and driving ICs have a thickness of approximately 300 μm, and are die-bonded to the unit substrate by a die-bond paste.

The aforementioned conventional semiconductor composite apparatuses suffer from the following drawbacks.

For example, because the LED chips and driving ICs are connected by wire-bonding, the LED chips and driving ICs are required to have large pads. The bonding pads are, for example, 100 μm×100 μm, much larger than the light emitting regions. In other words, the pads that do not directly contribute to emission of light occupy a larger area than regions that directly contribute to emission of light. This is uneconomical in terms of efficient utilization of material.

Wire bonding is done by applying a predetermined force on the wire and the pad. Therefore, the LED chips and driving ICs need to be as thick as several hundred microns, e.g., 300 μm. Wire bonding process also requires bonding pads to be thick. Thus, the thickness of the chips cannot be reduced any further as long as the chips are mounted on the unit substrate by the processes of dicing, picking-up, and bonding. Thus, reduction of the manufacturing cost cannot be achieved by decreasing the thickness of the chip.

SUMMARY OF THE INVENTION

The present invention was made in view of the aforementioned drawbacks of the prior art apparatuses.

An object of the invention is to provide a semiconductor composite apparatus that can be manufactured at low cost while maintaining sufficient functions and performance.

An object of the invention is to provide a printhead that uses the semiconductor composite apparatus, and an image forming apparatus that uses the printhead.

A semiconductor composite apparatus includes a first substrate, a semiconductor thin film layer, active devices, first driving circuits, and second driving circuits. The semiconductor thin film layer is formed on the first substrate and is formed of a first semiconductor material. The active devices are formed in the semiconductor thin film layer. The first driving circuits are formed of a second semiconductor material and perform a first function in which the active devices are driven. The second driving circuits are formed of a third semiconductor material, and perform a second function in which the active devices are driven. The second function is different from the first function.

With the semiconductor composite apparatus according to the present invention, the functions required for driving active devices are apportioned into first driving circuits and second driving circuits.

In this specification, the term "High speed" covers an operating frequency not lower than 5 MHz. The second driving circuits operate as a high-speed circuit that is connected to the active devices and directly drives the active devices. The first driving circuits operate as a low-speed circuit that is connected to the second driving circuits and controls the second driving circuits. The first driving circuits operate at a lower speed than the second driving circuits.

With the semiconductor composite apparatus, the high-speed circuits are formed of a third semiconductor material, which is expensive but is capable of fabricating high speed circuits that directly drive the active devices. The low-speed circuits are formed of a second semiconductor material, which is inexpensive but is only capable of fabricating low speed circuits that control the high speed circuits. In this manner, the functions required for driving active devices are apportioned into the high-speed circuits and the low-speed circuits.

In this specification, the term "Large-current" covers a driving current not lower than $5 \times 10^{-5}$ A. The term "Small-current" covers a driving current not more than $5 \times 10^{-5}$ A. The second driving circuits directly drive the active devices, and therefore are capable of driving a large current. The first driving circuits control the second driving circuits, and therefore are capable of driving only a small current. The second driving circuits are formed of the third semiconductor material capable of driving a large current. The first driving circuits are formed of the second semiconductor material capable of driving only a small current. In this manner, the functions required for driving active devices are apportioned into the large-current circuits and the low-speed circuits.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIG. 9 is a cross sectional view taken along a line B-B of FIG. 7;

FIG. 12 is a cross sectional view taken along a line B-B of FIG. 10;

FIG. 15 is a cross sectional view taken along a line B-B of FIG. 13;

FIG. 16 is a top view of the semiconductor composite apparatus according to a fifth embodiment;

FIG. 17 is a cross sectional view taken along a line A-A of FIG. 16;

DETAILED DESCRIPTION OF THE INVENTION

First Embodiment

A semiconductor composite apparatus is a semiconductor thin film. High-speed circuits are formed of a single crystal semiconductor, which is expensive but is capable of fabricating high speed circuits that directly drive the active devices. Low-speed circuits are formed of a poly crystal semiconductor, which is inexpensive but is only capable of fabricating low speed circuits that control the high speed circuits. In other words, the functions of the semiconductor composite apparatus are apportioned into the high speed circuits and low speed circuits, thereby preventing the deterioration of functions as well as maintaining low manufacturing cost.

Large-current driving circuits are formed of a material capable of fabricating large-current circuits. Small-current driving circuits are formed of a material capable of only fabricating small-current circuits that drive the large-current driving circuits. In other words, the functions of the driving circuits are apportioned into the large-current circuits and small-current circuits, thereby preventing deterioration of functions of the semiconductor composite apparatus and increase in manufacturing cost. In this specification, the term "High speed" covers an operating frequency not lower than 5 MHz. "Low speed" covers an operating frequency lower than 5 MHz. The term "Large-current" covers a driving current not lower than $5 \times 10^{-5}$ A. The term "Small-current" covers a driving current not more than $5 \times 10^{-5}$ A.

For the sake of convenience, the invention will be described, by way of example, with respect to a semiconductor composite apparatus that can be applied to an LED printhead for use in, for example, an electrophotographic printer.

Figure 1:
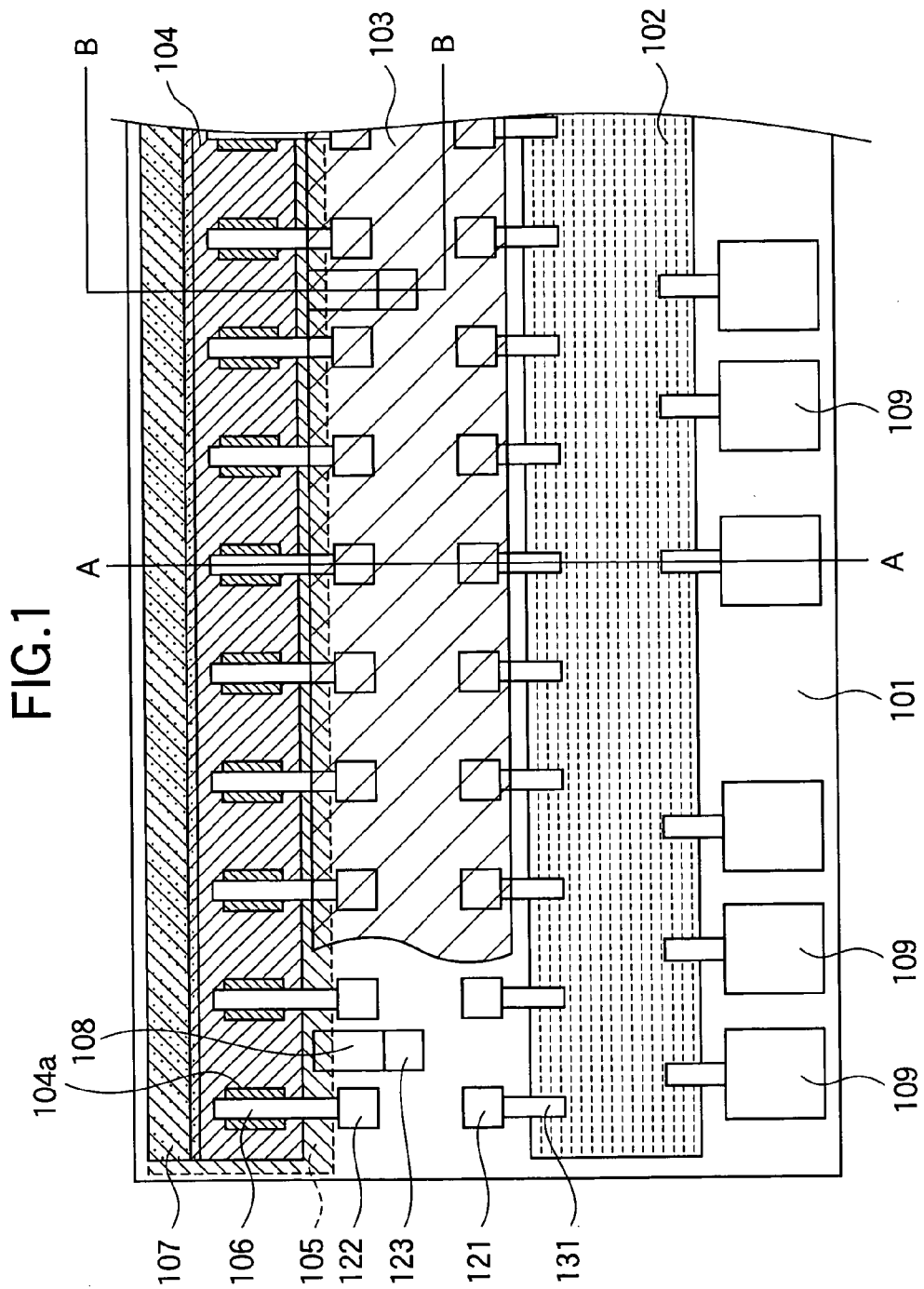
FIG. 1 is a top view of a pertinent portion of the semiconductor composite apparatus.
Figure 2:
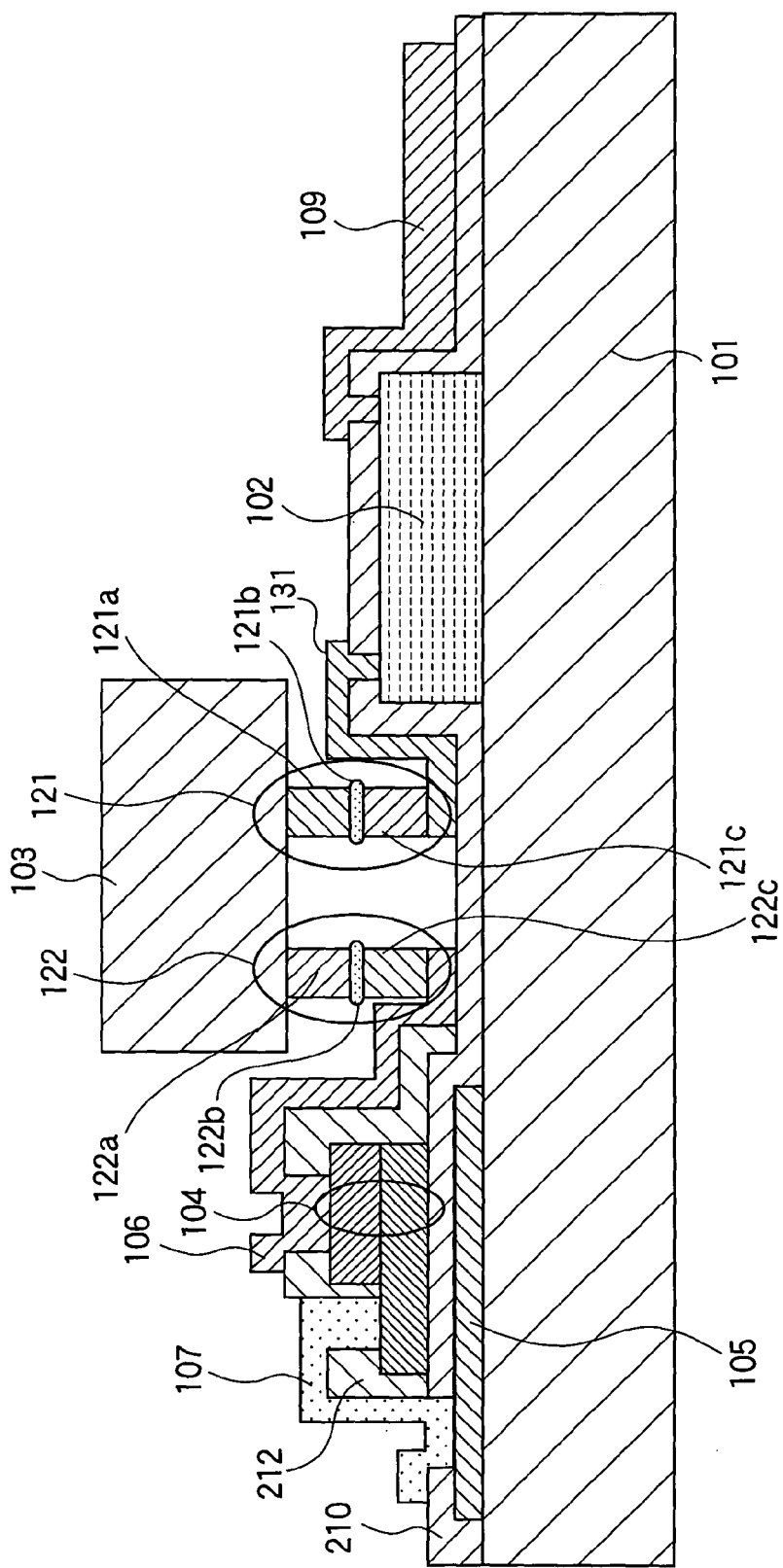
FIG. 2 is a cross sectional view taken along a line A-A of FIG. 1.
Figure 3:
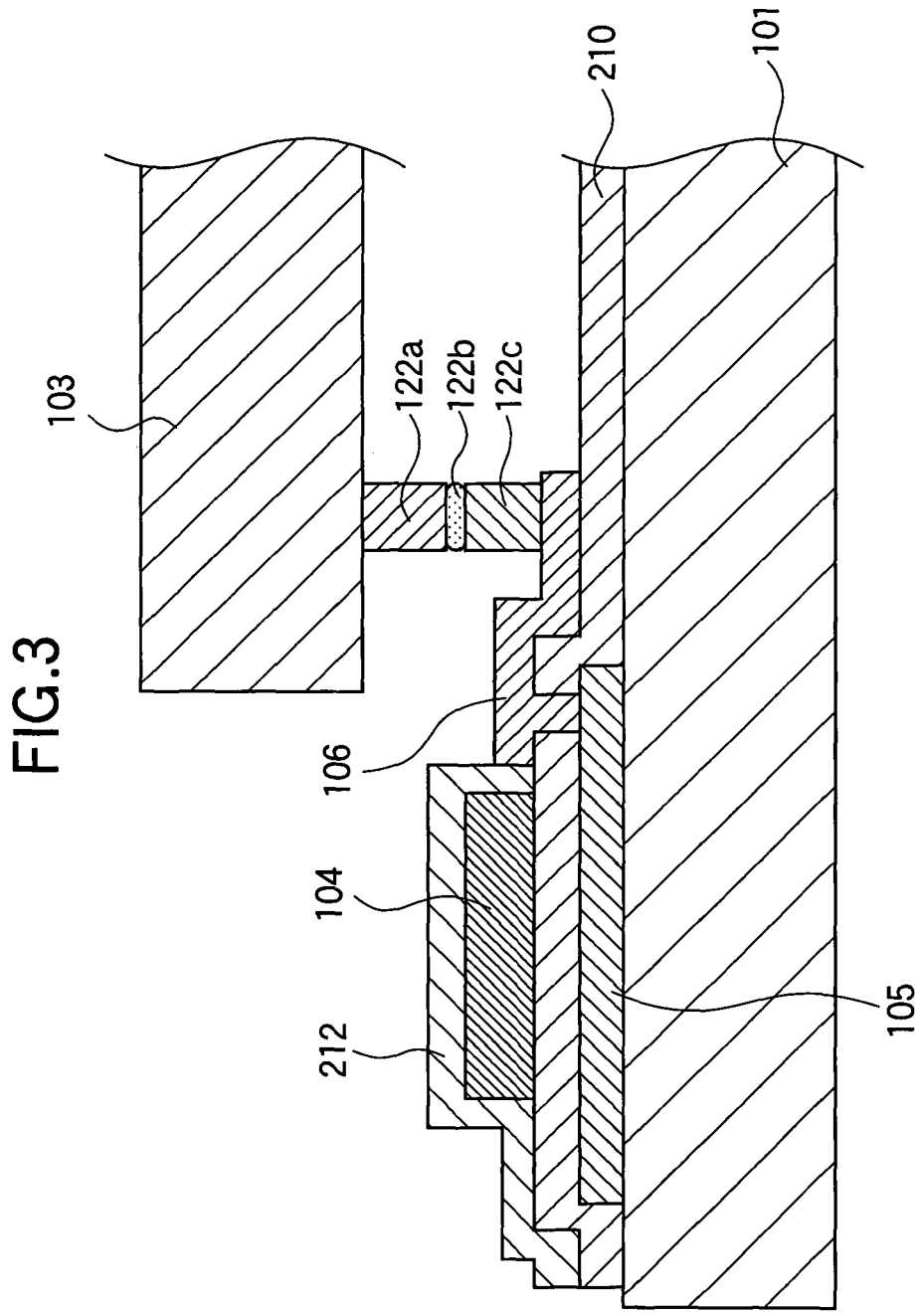
FIG. 3 is a cross sectional view taken along a line B-B of FIG. 1.

FIG. 1 is a top view of a pertinent portion of the semiconductor composite apparatus. FIG. 2 is a cross sectional view taken along a line A-A of FIG. 1. FIG. 3 is a cross sectional view taken along a line B-B of FIG. 1.

Referring to FIG. 1, the semiconductor composite apparatus includes a semiconductor thin film layer 104 fabricated on a first substrate 101 formed of an inorganic material such as a glass substrate or an organic material such as a plastics substrate. The semiconductor thin film layer 104 is formed of a first semiconductor material, which is, for example, a single layer of a compound semiconductor such as $Al_xGa_{1-x}As$, $Al_xGayIn_{1-x-y}P$, or $Ga_xIn_{1-x}AsyP_{1-y}$ ($1 \geq x \geq 0$, $1 \geq y \geq 0$) or a stacked structure of more than one of these layers with different values of the parameters x and y. The semiconductor thin film layer 104 includes light emitting regions 104a as a group of active devices having a pn junction. FIG. 1 illustrates a plurality of light emitting regions 104a produced by dividing the respective pn junctions by mesa etching, the light emitting regions being aligned in line at predetermined intervals. However, the plurality of light emitting regions 104a may include a plurality of groups of light emitting regions 104a, each of group having a plurality of light emitting elements 104a staggered with respect to each other in the direction perpendicular to the direction in which they are aligned.

Referring to FIGS. 2 and 3, formed on the first substrate 101 is a reflection layer 105 that reflects light emitted downwardly from the light emitting region 104, the light being reflected back toward the light emitting region 104. The reflection layer 105 is formed of a metal material in the form of a single layer formed of at least one selected from the group consisting of Ti, Pt, Au, Ge, Ni, Al, Cu, Pd, and W; a stacked structure of layers each of which is formed of at least one selected from the group consisting of Ti, Pt, Au, Ge, Ni, Al, Cu, Pd, and W; or an alloy film containing at least one selected from the group consisting of Ti, Pt, Au, Ge, Ni, Al, Cu, Pd, and W. The reflection layer 105 is electrically connected to a common electrode contact 108. The common electrode 108 is connected through a connection pad 123 to a ground terminal, not shown, of second driving circuits 103, which will be described later, to the ground. In other words, the reflection layer 105 also serves as a common wire to plurality of light emitting elements 104a. Also formed on the first substrate 101 are wiring layers, i.e., individual wires 106 and a common wire 107. The individual wire 106 is provided for a corresponding light emitting region 104a. The individual wire 106 is in the form of a stacked structure of a layer of Au and a layer of one selected from the group of Ti/Pt, Ge, and Ni, or an alloy of Au and at least one selected from the group of Ti, Pt, Ge, and Ni. One example of such a stacked structure is Ti/Pt/Au. The individual wire 106 may also take the form of an alloy film that contains Al, e.g., AlSiCu and Ni/Al. The common wire 107 is in the form of a stacked structure of a layer of Au and a layer of either Ge or Ni. The common wire 107 may also be an alloy of Au and at least one of Ge and Ni. For example, if the upper surface of the light emitting region 104a is a p-type semiconductor layer, the common wire 107 is a contact formed on an n-type semiconductor layer. The common wire 107 is electrically connected to the reflection layer 105. These wiring layers may be formed by using a semiconductor photolithographic process such as a lift-off process.

Formed on the first substrate 101 are first driving circuits 102 that control second driving circuits 103 (which will be described later) to drive the respective LEDs. The first driving circuits 102 are formed of a second semiconductor material whose base material is, for example, a poly crystal Si. The first driving circuits 102 are formed on a glass substrate simultaneously, and include circuits that control all of the LEDs. A power supply, not shown, supplies electric power to the first driving circuits 102 through connection pads 109. The first driving circuits 102 perform logical processes of input signals received from external circuits through the corresponding connection pads 109, thereby generating driving signals. For example, the first driving circuits 102 are digital circuits that process the input signals and hold the processed input signals, and may be implemented by using low-speed circuits, in which case the signals are processed at a low speed throughout the first driving circuits 102. The outputs of the first driving circuits 102 are fed to the second driving circuits 103 through the wires 131 and connection pads 121, and control the second driving circuits 103.

The second driving circuits 103 are conventional semiconductor chips formed of a third semiconductor material whose base material is, for example, a single crystal Si. The second driving circuits 103 are electrically connected to the connection regions in wiring regions formed on the first substrate 101, being bonded by flip-chip bonding or wire bonding. Specifically, the outputs of second driving circuits 103 are fed to the individual wires 106 for the respective LEDs through connection pads 122. In other words, the second driving circuits 103 are electrically connected to the three connection pads 121, 122, and 123. The second driving circuits 103 control current that energizes LEDs to light up. For example, the second driving circuits 103 convert the drive signals, logically processed by the first driving circuits 102, into a drive power for driving the LEDs. The second driving circuits 103 are controlled by the first driving circuits 102 in such a way that the second driving circuits 103 selectively drive the LEDs to emit light in accordance with the drive signals.

An interlayer dielectric film is formed in an appropriate region of a semiconductor composite apparatus to prevent short circuit. For this purpose, interlayer dielectric films (i.e., passivation film) 210 and 212 are formed on the first substrates 101 as shown in FIG. 2. The interlayer dielectric films 210 and 212 are formed preferably by plasma-activated chemical vapor deposition (PCVD) in which good coverage is obtained not to cause short circuit or cutting-off of wires at stepped portions. Alternatively, the stepped portions may be planarized by using a polyimide film, a spin-on glass (SOG) film, or any suitable technique suitable depending on the shapes of the stepped portions. Specifically, the interlayer dielectric film 210 is formed, preferably, of a polyimide film, a coating of organic film, or a spin-on glass film. The interlayer dielectric film 212 is preferably, for example, a SiN film.

The semiconductor thin film layer 104 includes an upper layer region and a lower layer region formed by mesa etching. The upper layer includes a pn junction. The lower layer region forms a common electrode. The second driving circuits 103 include connection pads (connection posts) 121a, 121c, 122a, and 122c, which are electrically connected to one another via paste layers 121b and 122b. The reflection layer 105 also serves as a conductive layer that connects between the common electrode and the second driving circuits 103 (FIG. 3).

Figure 4:
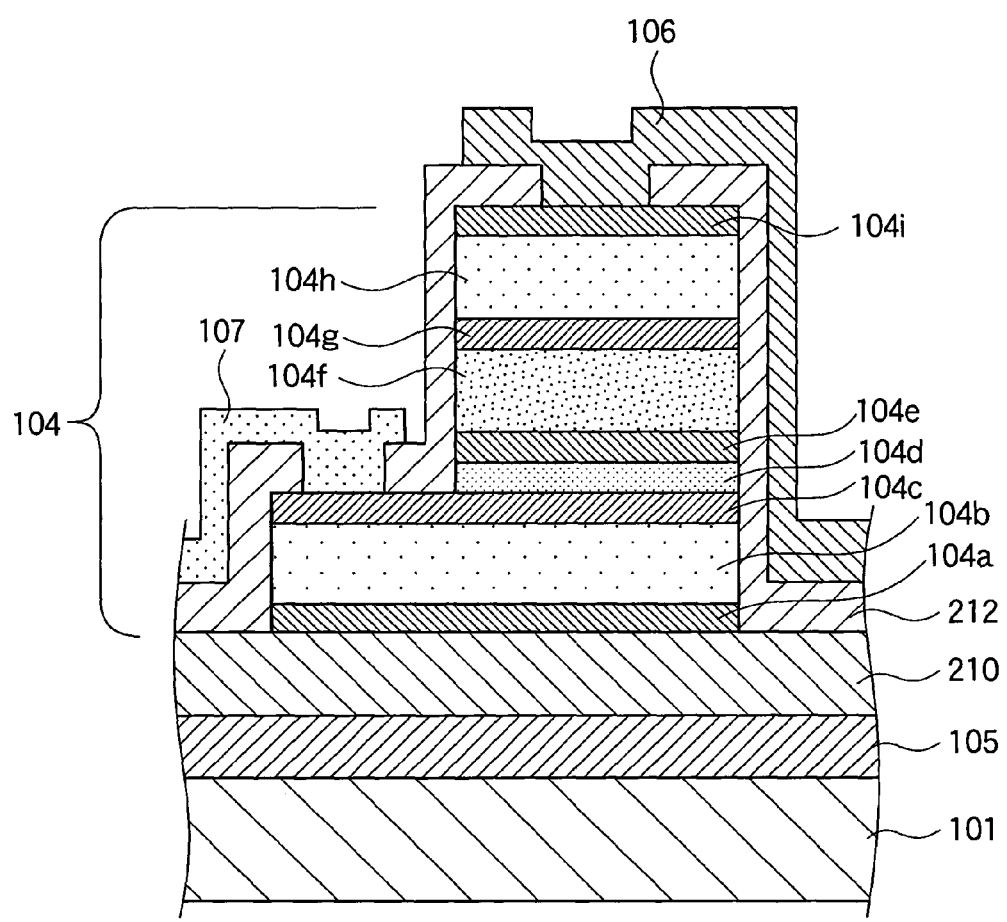
FIG. 4 illustrates a pertinent portion of the semiconductor thin film layer 104 of the aforementioned configuration.

FIG. 4 is a cross sectional view of a pertinent portion including the semiconductor thin film layer 104.

Specifically, a bonding layer 104a facilitates bonding of the semiconductor thin film layer 104 onto the upper surface of the interlayer dielectric film 210. Reference numeral 104b denotes a conductive layer. A contact layer 104c is of a second conductivity type. An etching stopping layer 104d stops mesa etching at the surface of the etching stopping layer but can be selectively etched by another etching method to expose the contact layer 104c. The contact layer 104c cannot be provided without the etching stopping layer 104d especially when the contact layer 104c is very thin. A buffer layer 104e provides high quality epitaxial layers grown on the etching stopping layer 104d. The reference numerals 104f, 104g, 104h, and 104i denote a lower cladding layer, an active layer, an upper cladding layer, and a first conductivity type contact layer, respectively. The bonding layer 104a, conductive layer 104b, contact layer 104c, etching stopping layer 104d, buffer layer 104e, lower cladding layer 104f, active layer 104g, upper cladding layer and 114h, and first conductivity type contact layer and 104i are formed in this order from the bottom.

The bonding layer 104a is a semiconductor layer having a smaller energy band gap than the active layer 104g, and is, for example, an n-type GaAs layer. The conductive layer 104b is, for example, an n-type $Al_tGa_{1-t}As$ (1>t>0). The second conductivity type contact layer 104c is an n-type GaAs layer. The etching stopping layer 104d may be selectively etched together with the contact layer 104c and an upper layer above the etching stopping layer 104d. When the contact layer 104c is an n-type GaAs layer, the etching stopping layer 104*d* is preferably an n-type In$_s$Ga$_{1-s}$P layer ($1 \geq s \geq 0$). The buffer layer 104*e* is, for example, an n-type GaAs layer having a smaller energy band gap than the active layer 104*g*, and plays an important role in improving the quality of the epitaxial grown layer formed above the etching stopping layer 104*d*. The lower cladding layer 104*f* is, for example, an n-type Al$_z$Ga$_{1-z}$As layer ($1>z>0$). The active layer 104*g* is an n-type Al$_y$Ga$_{1-y}$As layer ($1>y>0$). The upper cladding layer 104*h* is a p-type Al$_x$Ga$_{1-x}$As layer ($1>x>0$). The contact layer 104*i* of a first conductivity type is a p-type GaAs layer. The composition ratios of the respective layers are preferably such that $t>y$, $z>y$, and $x>y$. Of course, the semiconductor thin film layer 104 may have an appropriate composition ratio such that the relations among the x, y, z, and t are satisfied.

A portion of the flux of light emitted from the active layer 104*g* transmits downward, and passes through the buffer layer 104*e*, the contact layer 104*c*, and the bonding layer 104*a* to reach the reflection layer 105. Then, the light is reflected back by the reflection layer 105, and passes through the gluing layer 104*a*, contact layer 104*c*, buffer layer 104*e*, and contact layer 104*i* to be emitted outwardly of the side of the semiconductor thin film layer 104. Thus, the thinner the respective layers, the smaller the absorption of light. However, if the respective layers are too thin, then defects in the layers and/or sagging in the boundaries of stacked layers are caused, so that required functions cannot be obtained. From this point of view, the buffer layer 104*e*, contact layer 104*c*, and bonding layer 104*a* have a thickness preferably in the range of 5 to 100 nm. The etching stopping layer 104*d* has a thickness preferably in the range of 5 to 100 nm. The thickness of the semiconductor thin film layer 104 is preferably in the range of 0.1 to 20 µm for the following reasons.

When the semiconductor thin film layer 104 is very thin, the stress exerted by the interlayer dielectric film and wires causes cracks in the semiconductor thin film layer 104. Experiment by the inventors reveals that the cracks are hard to avoid when the thickness is less than 0.1 µm. A semiconductor thin film layer 104 having a relatively small thickness makes it difficult to handle when the semiconductor thin film layer 104 is bonded to the first substrate 101. A semiconductor thin film layer 104 having a relatively large thickness results in an increase in defects in the wires between LEDs and driving circuits. This is due to the fact that a large thickness causes a large step between the semiconductor thin film layer 104 and the first substrate 101, and therefore causes defective coverage of the interlayer dielectric layer and wires on the side surface of the semiconductor thin film layer 104. A semiconductor thin film layer 104 having a thickness more than 20 µm causes a large variation in the focal depth of an exposing apparatus during a photolithographic process for fabricating wire patterns, resulting in defective wiring patterns. Further, a small amount of resist tends to remain on the side surface of the semiconductor thin film layer 104. Residual resist is also a source of defective wiring pattern. One way of reducing the step between the semiconductor thin film layer 104 and the first substrate 101 is to form a thicker interlayer dielectric film. However, void of the semiconductor thin film layer 104 and deterioration of LEDs tends to occur due to the stress exerted by the interlayer dielectric film. From these points of view, the thickness of the semiconductor thin film is preferably in the range of 0.1 to 20 µm.

When signals are input from an external circuit, not shown, into the first driving circuits 102, the first driving circuits 102 performs various types of digital processing on the signals: resetting of the driving data and settings of the addresses of LEDs to be energized, the duration of energizing the LEDs, the timing of energizing the LEDs, and the current flowing through the LEDs. The, the first driving circuits 102 outputs the thus produced driving signals to the second driving circuits 103. In accordance with the driving signals, the second driving circuits 103 control the current that flows through the LEDs. Thus, the LEDs are properly energized.

The base material of the first driving circuits 102 is a poly crystal Si. A poly crystal Si allows forming of the first driving circuits 102 in a large area simultaneously. However, if the crystal grains are not so large, there are too many grain boundaries, the life of carriers is shorter, the resistance of the material is higher, the mobility of carriers is lower. Thus, such a crystal does not lend itself to high speed applications. The poly crystal Si may be re-crystallized into larger crystals but is not as good as the single crystal in a large-current driving operation and a high-speed operation. Thus, the semiconductor composite apparatus of the invention does not need poly crystal Si circuit elements for controlling driving current of the LEDs.

The control of the current fed into the LEDs is performed by the second driving circuits 103 whose base material is a single crystal. The functions of driving the LEDs are apportioned into the first driving circuits 102 and second driving circuits 103. Digital processing (logic processing) is performed only by the first driving circuits 102 that are formed of a poly crystal Si. In this manner, all of the required functions are accomplished at low manufacturing costs.

As described above, because the LEDs in the semiconductor thin film layer 104 are connected to their driving circuits through thin film wiring patterns, the semiconductor thin film layer 104 having LEDs formed therein can be greatly reduced in thickness. Further, the driving circuits for controlling the current flowing through the LEDs are formed on a material whose base material is a single crystal Si. The semiconductor circuits for processing the drive signals are formed of a material whose base material is a poly crystal Si. In other words, the functions are apportioned into circuit devices according to the semiconductor materials of which the circuit devices are formed, thereby reliably controlling the current required for energizing the LEDs. Further, the circuit elements formed on a poly crystal Si can be formed simultaneously in a large area. This is greatly effective in reducing the manufacturing cost as opposed to forming all the circuit elements on a single crystal Si.

The semiconductor thin film layer 104 may be of another configuration.

Figure 5:
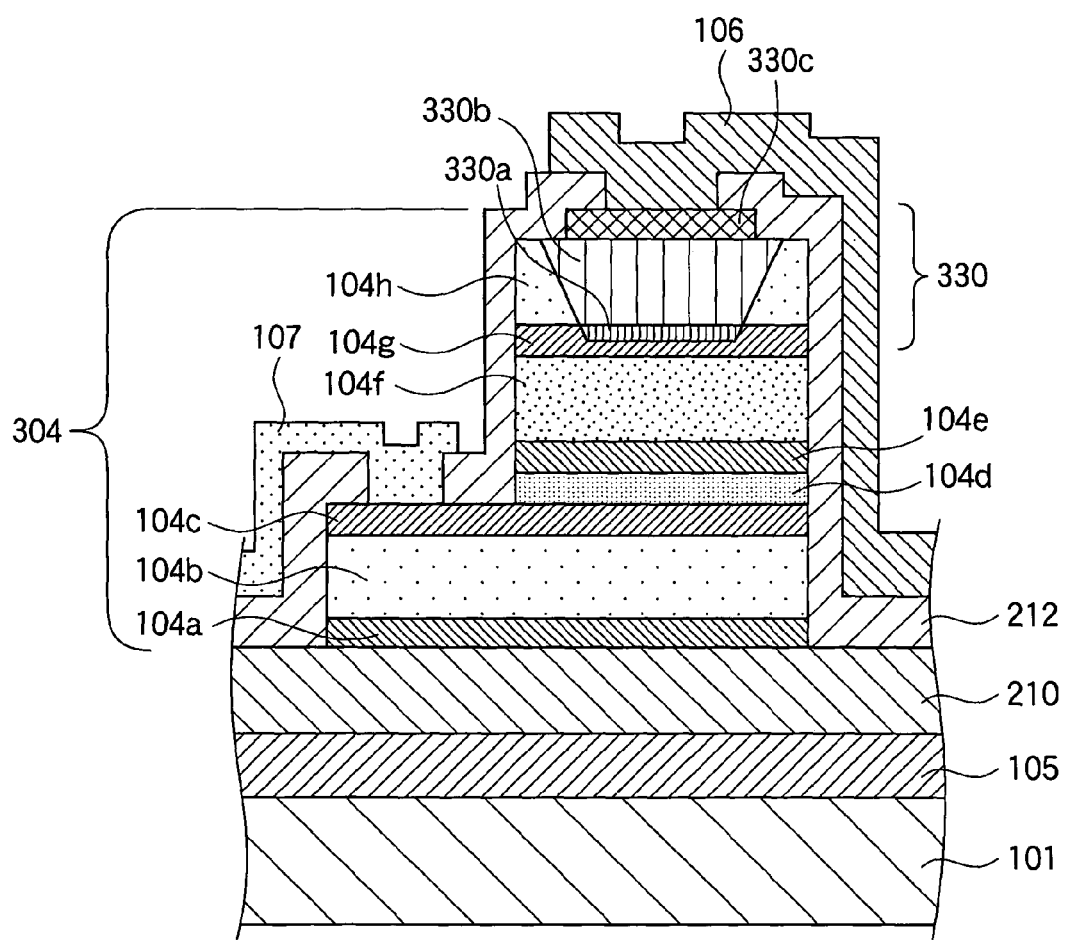
FIG. 5 illustrates a modification to the semiconductor composite apparatus according to the first embodiment.

FIG. 5 illustrates a modification to the semiconductor composite apparatus according to the first embodiment. Referring to FIG. 5, the semiconductor thin film layer 104 may be replaced by a semiconductor thin film layer 304 having a pn junction of a type different from the semiconductor thin film layer 104. An impurity of a first conductivity type (p-type impurity) is selectively diffused into a semiconductor layer of a second conductivity type (n-type semiconductor layer) to form a p-type diffusion region 330 (contact layer of the first conductivity type) The p-type diffusion region 330 is as deep as the diffusion front reaches the active layer 104*g*. A diffusion region 330*a* that has diffused into the active layer 104*g* is, for example, a p-type Al$_y$Ga$_{1-y}$As layer. A diffusion region 330*b* formed in the upper cladding layer 104*h* is a p-type Al$_x$Ga$_{1-x}$As layer. An uppermost contact layer 330*c* of a first conductivity type is separated from a contact layer of a second conductivity type (n-type contact layer) The common wires 107 are formed on the second conductive contact layer (n-type contact layer) of a second conductivity type.

Figure 6:
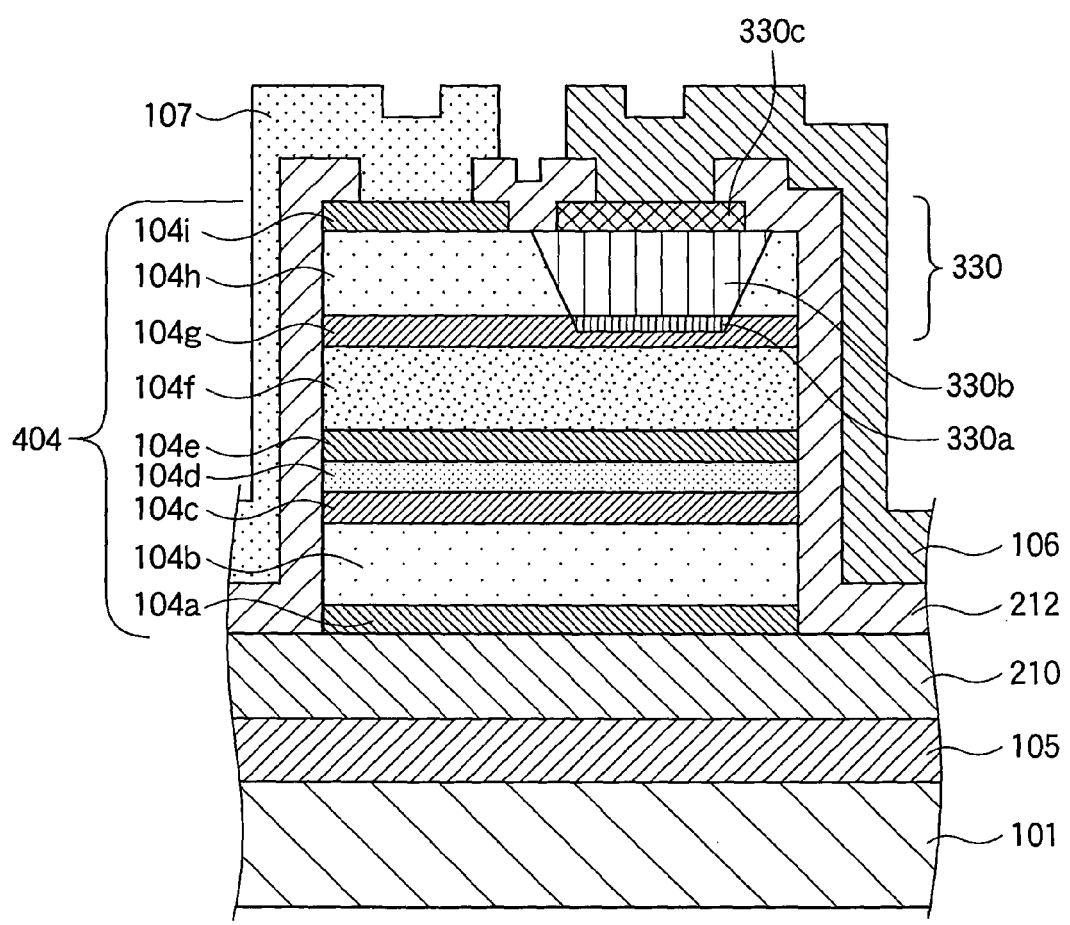
FIG. 6 illustrates another modification to the semiconductor composite apparatus according to the first embodiment.

FIG. 6 illustrates another modification to the semiconductor composite apparatus according to the first embodiment;

Still alternatively, the semiconductor thin film layer may be a semiconductor thin film layer 404 with the common wires 107 (common contact layer) formed on the uppermost layer 104i as shown in FIG. 6.

Another form of the pn junction in the semiconductor thin film layer may be such that the light emitting elements are divided deep enough to the lowermost layer by etching. Still another way of driving the LEDs may be a time-division driving method instead of a simultaneous driving method.

The first driving circuits 102 may also be implemented as a low speed circuit, and the second driving circuits 103 may also be implemented as a high speed circuit. The first driving circuits 102 may be in digital form and the second driving circuits 103 may be in analog form. The first driving circuits 102 may be implemented as a large scale logic circuit, and the second driving circuits 103 may be implemented as a small scale circuit. Such a configuration allows fabrication of the first driving circuits 102 on the poly crystal Si that can occupy a relatively large area on, for example, a glass substrate. This eliminates limitations in the scale of circuit and reduces the manufacturing cost. The second driving circuits 103 are required to operate at a high speed, and are preferably formed in a single crystal semiconductor (e.g., single crystal silicon or single crystal compound semiconductor such as a single crystal GaAs) where the mobility of electrons is high.

Second Embodiment

In the first embodiment, the second driving circuits 103 are formed of the third semiconductor materials on a substrate. A second embodiment differs from the first embodiment in that the second driving circuits 103 are formed of the third semiconductor materials in a semiconductor thin film. Configurations similar to those in the first embodiment have been given the same reference numerals and their description is omitted.

Figure 7:
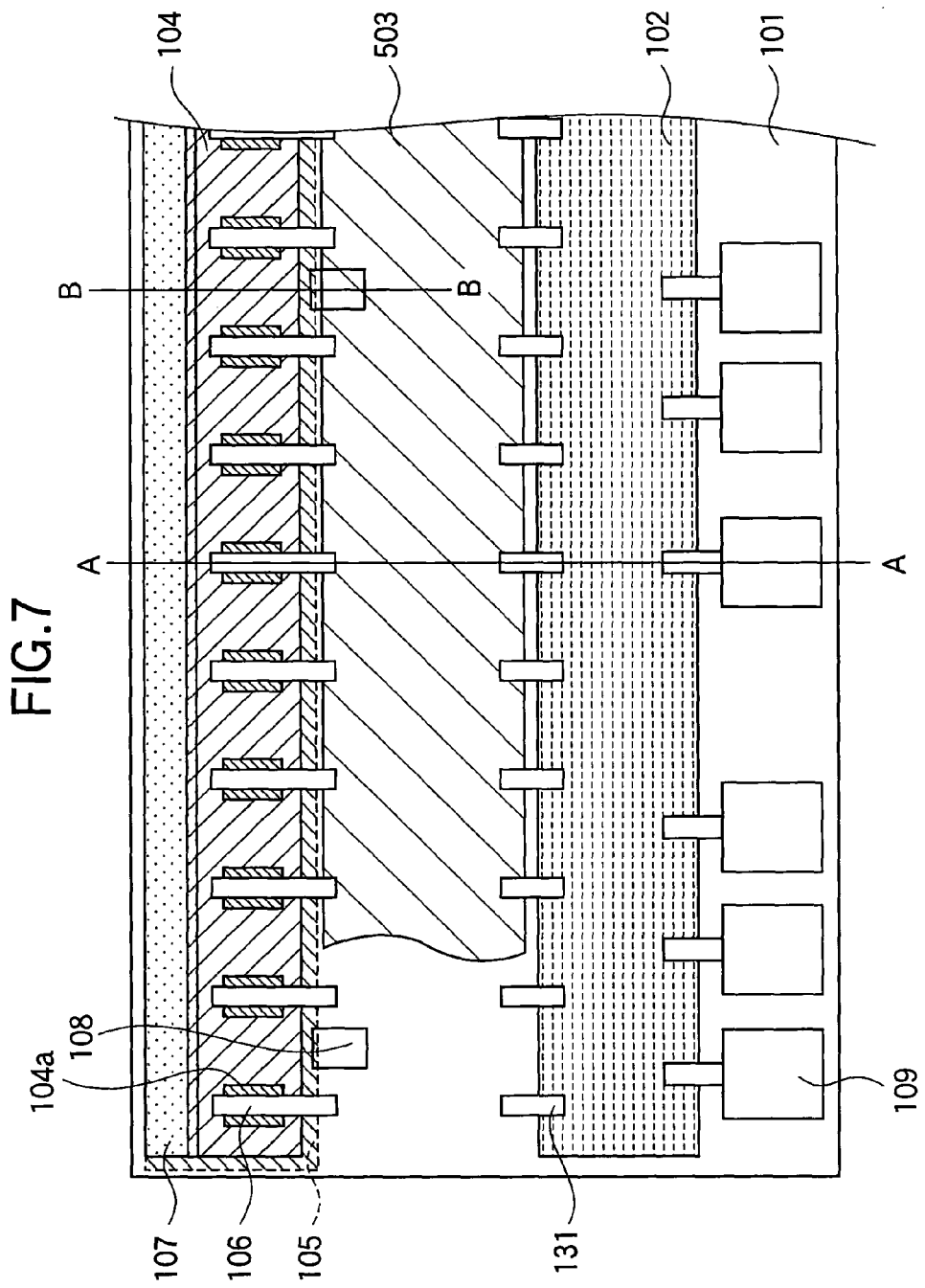
FIG. 7 is a top view illustrating a pertinent portion of the semiconductor composite apparatus according to a second embodiment.
Figure 8:
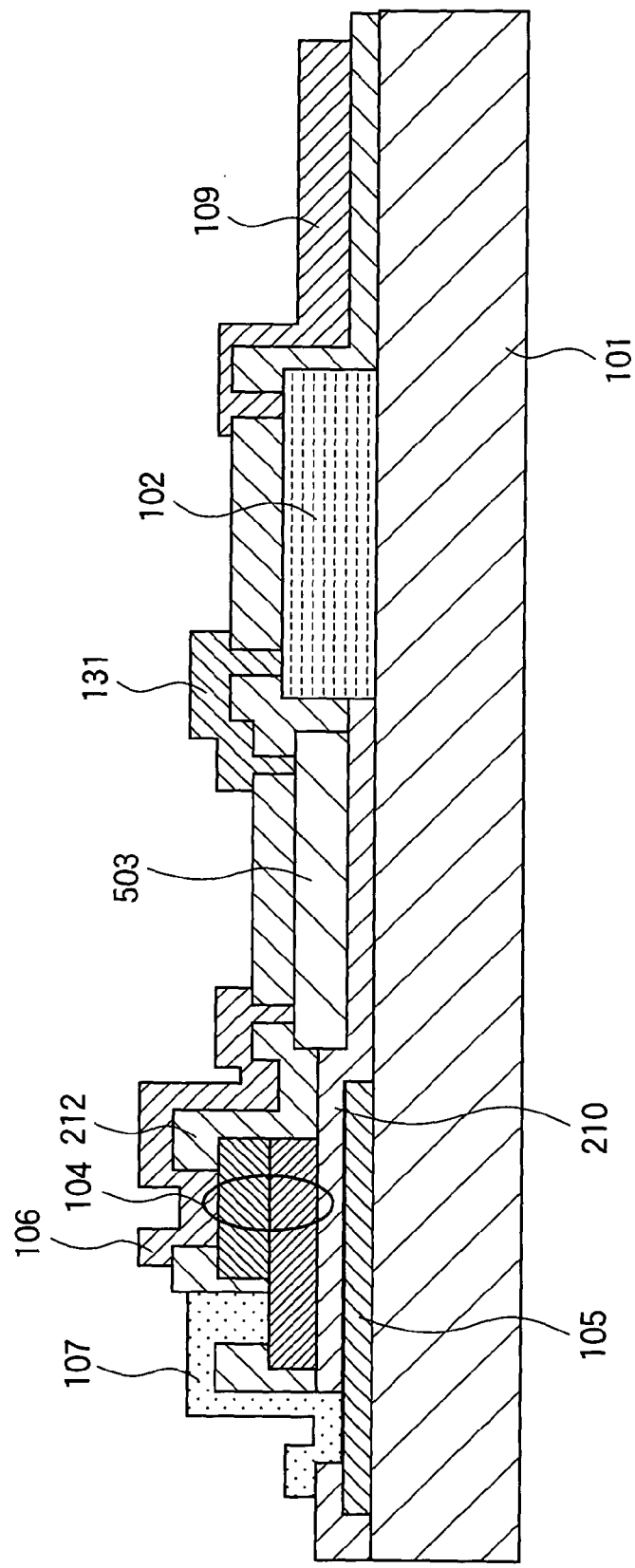
FIG. 8 is a cross sectional view taken along a line A-A of FIG. 7.

FIG. 7 is a top view illustrating a pertinent portion of the semiconductor composite apparatus. FIG. 8 is a cross sectional view taken along a line A-A of FIG. 7. FIG. 9 is a cross sectional view taken along a line B-B of FIG. 7. For better understanding of the structure, the interlayer dielectric film is omitted from FIG. 7.

In other words, the semiconductor composite apparatus includes first driving circuits 102 and the aforementioned semiconductor thin film layer 104 in the first embodiment, formed on the first substrate such as a glass substrate or a plastics substrate. The first driving circuits 102 are formed of second semiconductor materials such as a poly crystal Si and an organic semiconductor material. The poly crystal Si and organic semiconductor material may be formed on the first substrate 101 simultaneously. The semiconductor thin film layer 104 may be replaced by the semiconductor thin film layers 304 and 404 previously mentioned in the first embodiment. When the first driving circuits 102 control the light emitting elements to light up, the first driving circuits 102 operate from the electric power supplied via the connection pads 109 from a power supply, not shown. The first driving circuits 102 perform the logic processing of the signals received via the connection pads 109 from external circuits not shown, and produce driving signals.

The semiconductor composite apparatus is provided with second driving circuits 503 in place of the second driving circuits 103 in the first embodiment, the second driving circuits 503 controlling the current that flows through the LEDs. The second driving circuits 503 are semiconductor thin films formed of a third semiconductor material whose base material is a single crystal Si. Individual wires 106, common wire 107, and common electrode 108 are electrically connected to the second driving circuits 503. The first driving circuits 102 and second driving circuits 103 are interconnected through wires 131. A reflection layer 105, the individual wires 106, and the common wire 107 may be formed of the same materials as those in the first embodiment.

The electrical connections between the second driving circuits 503 and LEDs and between the second driving circuits 503 and the first driving circuits 102 are preferably made using thin film wires formed in a semiconductor photolithographic process. For this reason, the semiconductor thin film of the second driving circuits 503 is preferably not more than 20 μm thick.

As described above, because the second driving circuits 503 are semiconductor thin films formed on a substrate whose base material is single crystal Si and are bonded on the first substrate 101, all of the devices can be interconnected using thin film wires that make it easy to form and connect wire patterns. Thus, the electrical connections are highly reliable.

Just as in the first embodiment, the semiconductor material, metal material, and/or substrate materials for the semiconductor composite apparatus may be selected appropriately according to specific requirements.

Third Embodiment

A third embodiment differs from the first and second embodiments in the configuration of first driving circuits and second driving circuits. Elements similar to those in the first and second embodiments have been given the same reference numerals and their description is omitted.

Figure 10:
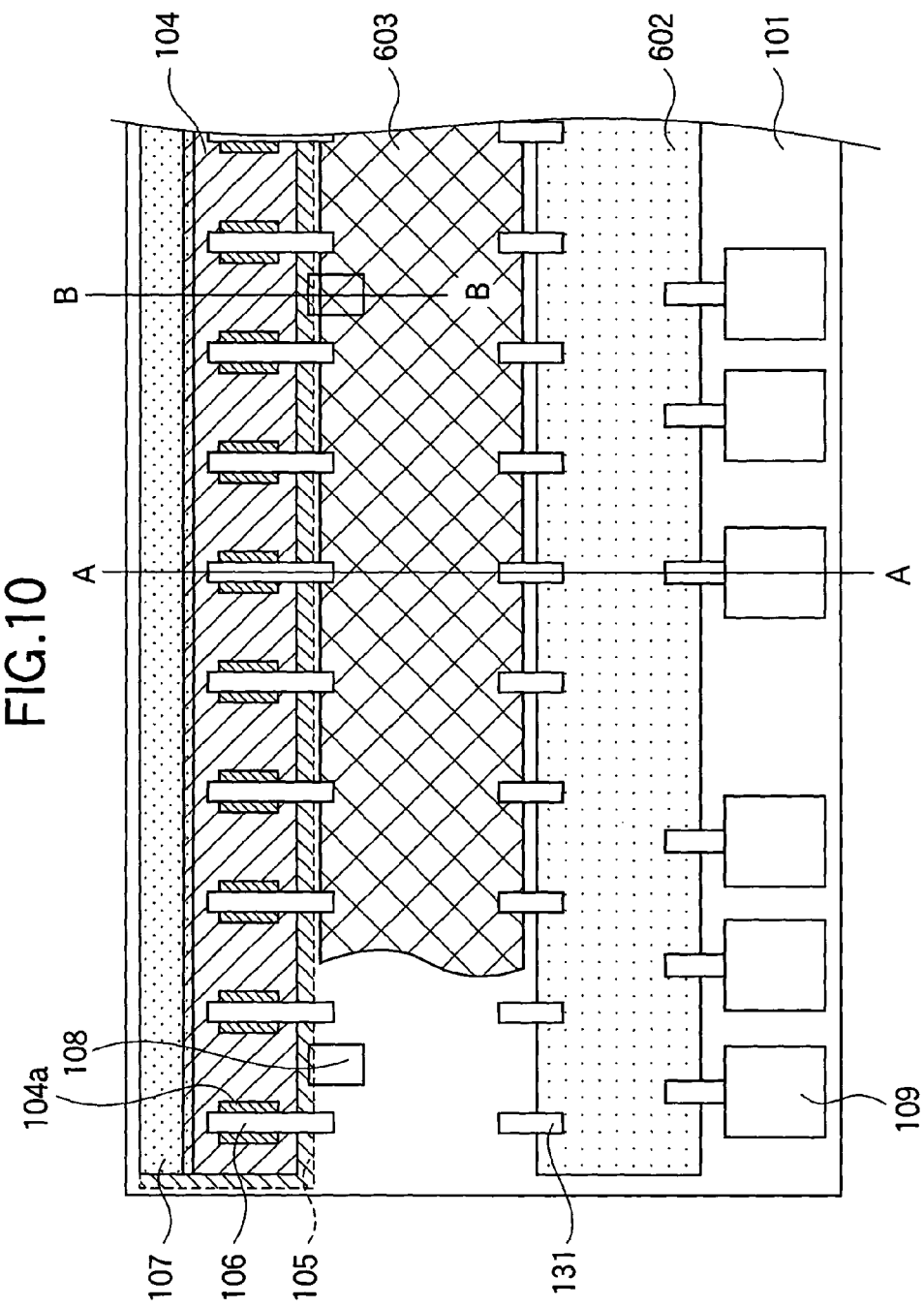
FIG. 10 is a top view of a pertinent portion of the semiconductor composite apparatus according to a third embodiment.
Figure 11:
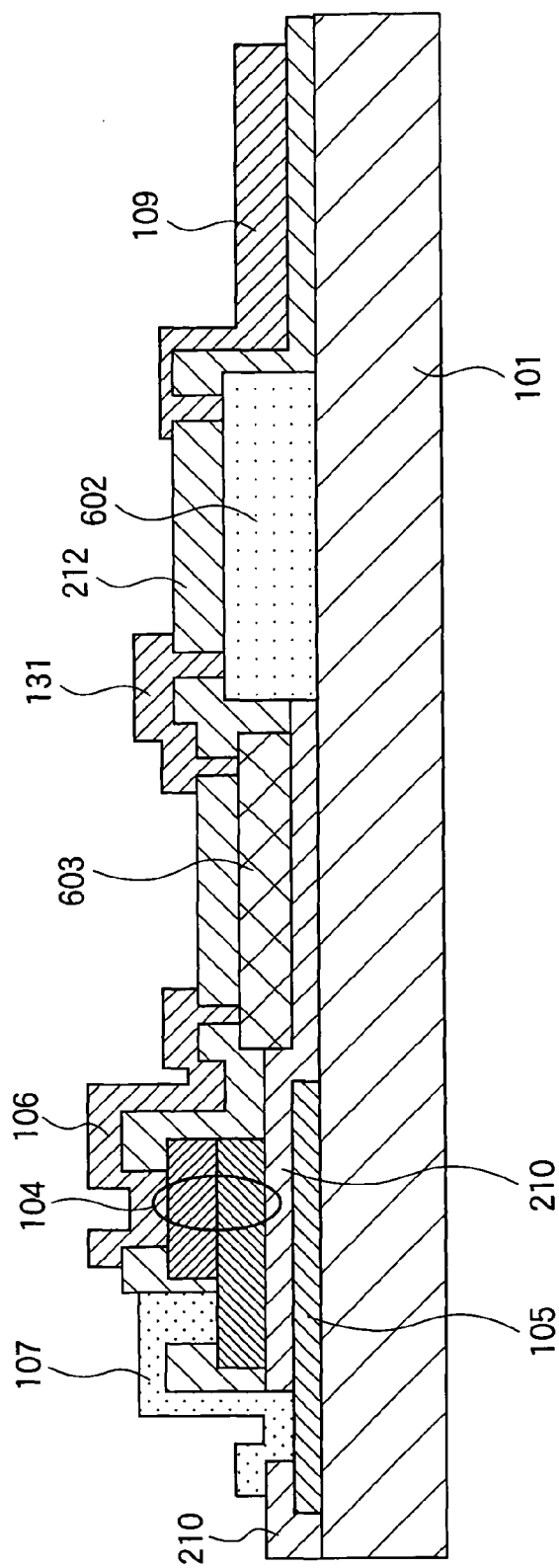
FIG. 11 is a cross sectional view taken along a line A-A of FIG. 10.

FIG. 10 is a top view of a pertinent portion of a semiconductor composite apparatus according to the third embodiment. FIG. 11 is a cross sectional view taken along a line A-A of FIG. 10. FIG. 12 is a cross sectional view taken along a line B-B of FIG. 10. For better understanding of the embodiment, an interlayer dielectric film is omitted from FIG. 10. While the third embodiment will be described in terms of the semiconductor thin film layer 104 in the first embodiment, the semiconductor thin film layers 304 and 404 in the first embodiment may of course be used.

The second driving circuits 103 in the first embodiment and the second driving circuits 503 in the second embodiment are formed of a material whose base material is a single crystal Si, on a substrate or within a semiconductor thin film. In contrast, second driving circuits 603 in the third embodiment are formed within a semiconductor thin film whose base material is a poly crystal Si.

The first driving circuits 102 in the first and second embodiments are formed of a semiconductor thin film whose base material is a poly crystal Si. In contrast, first driving circuits 602 in the third embodiment are formed of a second semiconductor material whose base material is an organic semiconductor material.

The poly crystal Si for the second driving circuits 603 is formed by the re-crystallization, using a laser, of a poly Si formed on the first substrate 101. The second driving circuits 603 has a mobility of electrons not less than 300 Vcm/s so that the second driving circuits 603 can operate at a high speed and controllably drive a current on the order of 1 mA.

The organic semiconductor material for the first driving circuits 602 also has a mobility of electrons not less than 1 Vcm/s.

The second driving circuits 603 formed of a material whose base material is poly crystal Si, and the first driving circuits 602 formed of a material whose base material is an organic semiconductor material. The first driving circuits 602 and second driving circuits 603 are provided on the first substrate 101 simultaneously. The electrical connection between the second driving circuits 603 and LEDs and between the second driving circuits 603 and the first driving circuits 602 are made via thin film wires formed in a semiconductor photolithographic process.

As described above, the first driving circuits 602 are formed of a material whose base material is an organic semiconductor material, and the second driving circuits 603 are formed of a material whose base material is a poly crystal Si. Thus, the first driving circuits 602 and second drive circuits 603 can be formed simultaneously in a large area. Thus, the semiconductor composite apparatus according to the third embodiment is effective in greatly reducing the manufacturing costs while also maintaining the necessary overall functions.

Fourth Embodiment

A semiconductor composite apparatus according to a fourth embodiment differs from the first to third embodiments in that an optical lens is provided under a first substrate and focuses light emitted from LEDs. Elements similar to those in the first to third embodiments have been given the same reference numerals and their description is omitted.

Figure 13:
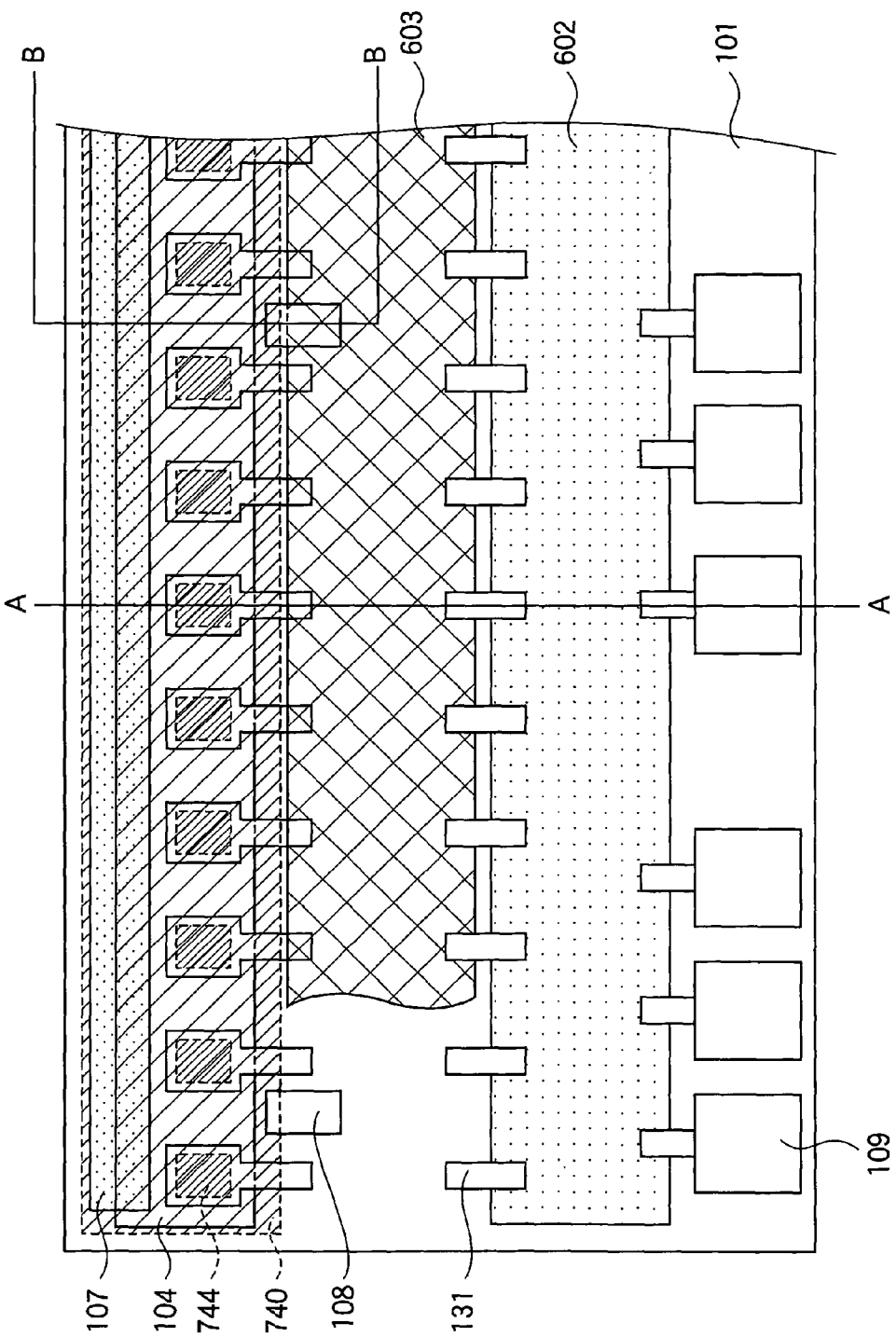
FIG. 13 is a top view illustrating a pertinent portion of the semiconductor composite apparatus according to a fourth embodiment.
Figure 14:
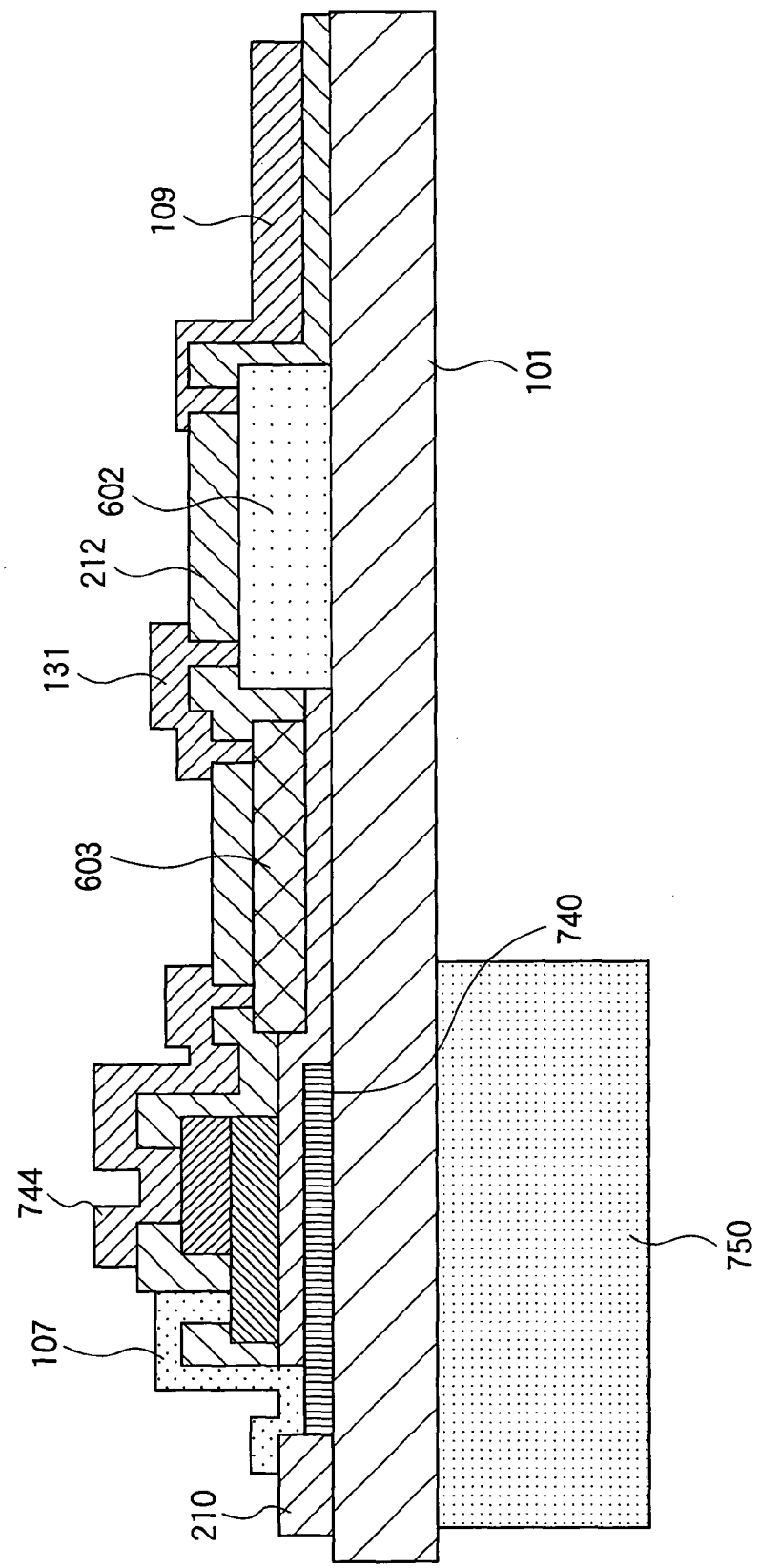
FIG. 14 is a cross sectional view taken along a line A-A of FIG. 13.

FIG. 13 is a top view illustrating a pertinent portion of the semiconductor composite apparatus. FIG. 14 is a cross sectional view taken along a line A-A of FIG. 13. FIG. 15 is a cross sectional view taken along a line B-B of FIG. 13. For better understanding of the embodiment, an interlayer dielectric film is omitted from FIG. 13. While the fourth embodiment will be described in terms of the semiconductor thin film layer 104, first driving circuits 602, and second driving circuits 603 in the third embodiment, the semiconductor thin film layers 304 and 404 in the first embodiment may of course be used in place of the semiconductor thin film layer 104. Further, the first driving circuits 102 (first embodiment) may be used in place of the first driving circuits 602. Still further, the second driving circuits 103 (first embodiment) and 503 (second embodiment) may be used in place of the second driving circuits 603.

The semiconductor composite apparatus according to the first to third embodiments has a reflection layer 105 formed under the semiconductor thin film layer 104 that contains LEDs, the reflection layer 105 reflecting the light emitted toward the lower surface of the first substrate 101 back toward the upper surface.

The semiconductor thin film layer 104 according to the fourth embodiment has a reflection layer on the surface above the LEDs and an optical lens on the side of the substrate remote from the surface in which the LEDs are formed. The optical lens gathers the light and focuses the light into small spots on an image forming surface of a photoconductive drum of an image forming apparatus.

Specifically, the upper surface of the semiconductor thin film 104 is covered with an individual electrode 744 that also serves as a reflection layer. Thus, the light emitted upward is reflected downward by the individual electrode 744. The individual electrode 744 may be in the form of a stacked structure of a layer of Au and a layer of one selected from the group of Ti/Pt, Ge, and Ni, or an alloy of Au and at least one selected from the group of Ti, Pt, Ge, and Ni. One example of such a stacked structure is Ti/Pt/Au. The individual wire 106 may also take the form of an alloy film that contains Al, e.g., AlSiCu and Ni/Al. A transparent conductive film 740 is formed of ITO or ZnO through which light emitted from the LEDs is transmitted. A common electrode contact 108 connects the common electrode to the second driving circuits 603 through the transparent conductive film 740. Therefore, a common wire may be routed on the other side of the common electrode contact 108. While the transparent conductive film 740 is used to route the common wire, a wire may also be formed above the semiconductor layer 104 in which case the transparent conductive film 740 need not be conductive and only needs to be a thin film transparent to light.

An optical lens 750 is formed on the underside of the first substrate 101, gathering the light reflected downward by the individual electrode 744 and focuses the reflected light into small spots on the image forming surface of the photoconductive drum. The optical lens 750 is a rod lens array in which rod lenses are aligned across the full-length of a line of LEDs. The first substrate 101 has a thickness preferably substantially equal to the focal length of the optical lens 750 such that the light is focused by the optical lens 750 into small spots on the image forming surface of the photoconductive drum. Thus, the distance between the optical lens 750 and the LEDs need not be adjusted, so that the assembly process of the optical lens 750 may be simplified.

The semiconductor composite apparatus requires to be configured so that light emitted from the LEDs is incident on the optical lens 750 via the first substrate 101. Thus, the first substrate 101 is preferably transparent to the wavelength of the light emitted from the LEDs as possible. For this reason, the first substrate 101 may be formed of optically transparent glass substrate or a plastics substrate.

As described above, the optical lens 750 is provided on the underside of the first substrate 101 having a thickness substantially equal to the focal length of the optical lens 750, simplifying the adjustment of the focal distance of the optical lens 750, the adjustment of the position of the optical lens 750 relative to the LEDs, and the assembly process of the optical lens 750.

Fifth Embodiment

A semiconductor composite apparatus according to a fifth embodiment includes first driving circuits, second driving circuits, and LEDs, which are formed on a first substrate. The semiconductor composite apparatus further includes respective devices, connectors through which signals and electric power are fed from external circuits and electric power, wires that electrically connect between connectors, and third driving circuits that communicate signals between the first driving circuits and between the second driving circuits. Elements similar to those in the first to fourth embodiments have been given the same reference numerals and their description is omitted.

FIG. 16 is a top view of the semiconductor composite apparatus according to the fifth embodiment. FIG. 17 is a cross sectional view taken along a line A-A of FIG. 16. The semiconductor composite apparatus will be described in terms of the semiconductor thin film layer 104, first driving circuits 102 and second driving circuits 103 described in the first embodiment. However, the semiconductor thin film layers 304 and 404 in the first embodiment may also be used in place of the semiconductor thin film layer 104. Further, the first driving circuits 102 may be replaced by the first driving circuits 602 (third embodiment), and the second driving circuits 103 may be replaced by the second driving circuits 503 (second embodiment) and 603 (third embodiment).

Specifically, the semiconductor composite apparatus includes wiring regions 860 and 862 formed on a first substrate 101 as shown in FIG. 16. Signals and electric power are received from external circuits via a connector 864. The signals are directed to the first driving circuits 102 via the wiring regions 860 and 862. The electric power and the ground potential are supplied to the first driving circuits 102 and second driving circuits 103 via the wiring regions 860 and 862. The first driving circuits 102 send signals to the external circuits via the wiring regions 860 and 862. The wiring regions 860 and 862 are also used as a region on which electronic components and a memory are mounted for processing signals, stabilizing the electric power, dividing the supply voltage, and/or compensating for temperature changes.

The third driving circuits 850 communicate signals between the first driving circuits 102 and between the second driving circuits 103. The third driving circuits 850 are formed of a material whose base materials are, for example, both a single crystal Si and a poly crystal Si. Alternatively, the third driving circuits 850 may be formed of materials whose base material is a single crystal Si, poly crystal Si, or an organic semiconductor material. The third driving circuits 850 perform logical processing of the signals received from the external circuits before driving the LEDs. More specifically, the third driving circuits 850 are mounted on a wiring layer 871 by flip chip bonding. A plurality of electrodes 851 are formed on the third driving circuits 850. The electrodes 851 are electrically connected to connection posts 872 by means of pastes 873. The wiring layer 871 is formed on a dielectric layer 870 provided on the first substrate 101. The third driving circuits 850 may take a variety of forms, and can be fabricated in a variety of methods. For example, the third driving circuits 850 may be wire-bonded.

As described above, the semiconductor composite apparatus includes the respective devices, first driving circuits 102, second driving circuits 103, semiconductor thin film 104 (LEDs), the connector 864, wiring regions 860 and 862, and third driving circuits 850, thereby simplifying the configuration of the external circuits.

Sixth Embodiment

A semiconductor composite apparatus according to a sixth embodiment differs from the fifth embodiment in that third driving circuits are formed in a semiconductor thin film instead of on a substrate. Elements similar to those in the fifth embodiment have been given the same reference numerals and the description is omitted.

Figure 18:
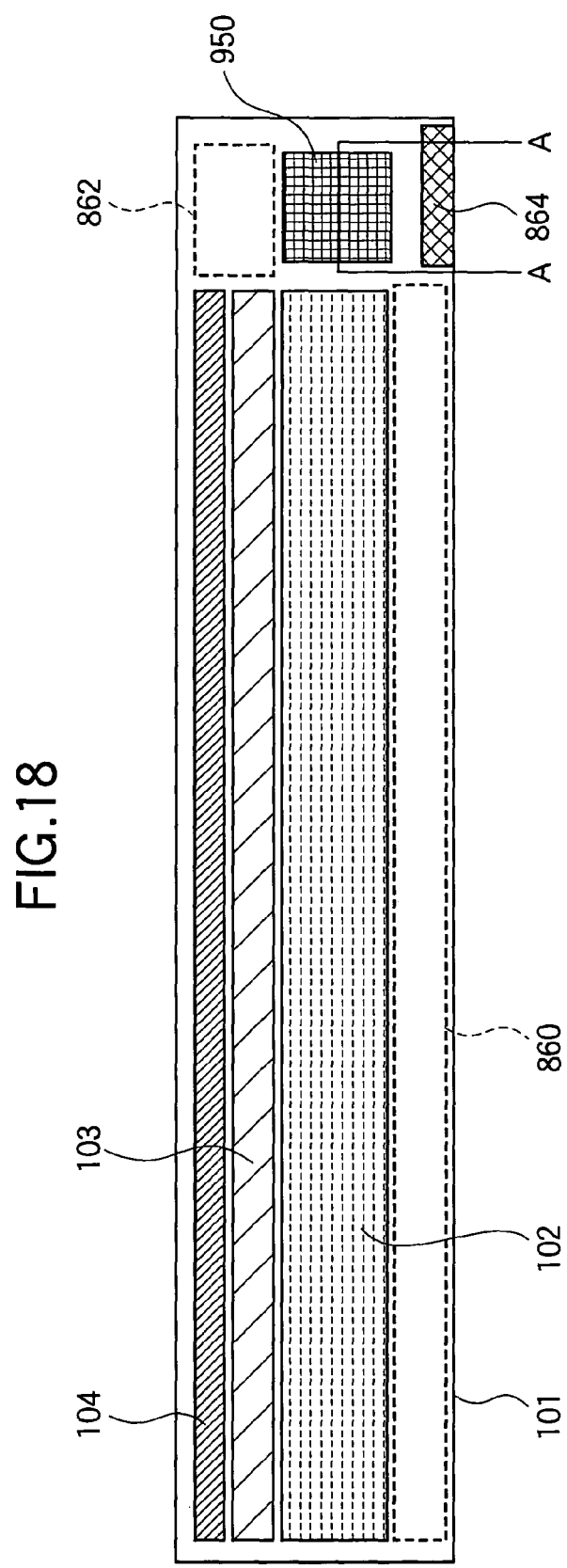
FIG. 18 is a top view of the semiconductor composite apparatus according to a sixth embodiment.
Figure 19:
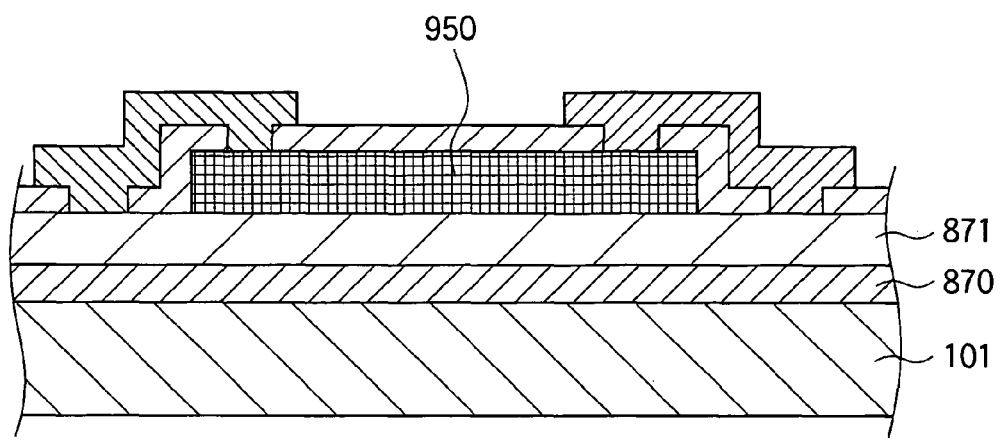
FIG. 19 is a cross sectional view taken along a line A-A of FIG. 18.

FIG. 18 is a top view of the semiconductor composite apparatus. FIG. 19 is a cross sectional view taken along a line A-A of FIG. 18. While the semiconductor composite apparatus will be described in terms of the semiconductor thin film layer 104, first driving circuits 102, and second driving circuits 103 described in the first embodiment, the semiconductor thin film layer 104 may be replaced by the semiconductor thin film layers 304 and 404 previously mentioned in the first embodiment. Further, the first driving circuits 102 may be replaced by the first driving circuits 602 (third embodiment) and the second driving circuits 103 may be replaced by the second driving circuits 503 (second embodiment) and 603 (third embodiment).

Specifically, the semiconductor composite apparatus includes third driving circuits 950 capable of performing logical processing of the signals received from the external circuits for driving the LEDs. The third driving circuits 950 are formed in the form of a semiconductor thin film as shown in FIG. 19.

Because the third driving circuits 950 are in the form of a semiconductor thin film, thin film wires can be used to make the electrical connection between the third driving circuits 950 and other circuits and the electrical connection between the third driving circuits 950 and wiring regions. Therefore, the wiring structure is simplified, and is highly reliable. The third driving circuits can be formed simultaneously in a large area.

The third driving circuits 950 formed of a semiconductor thin film allows the following modifications to the semiconductor composite apparatus.

Figure 20:
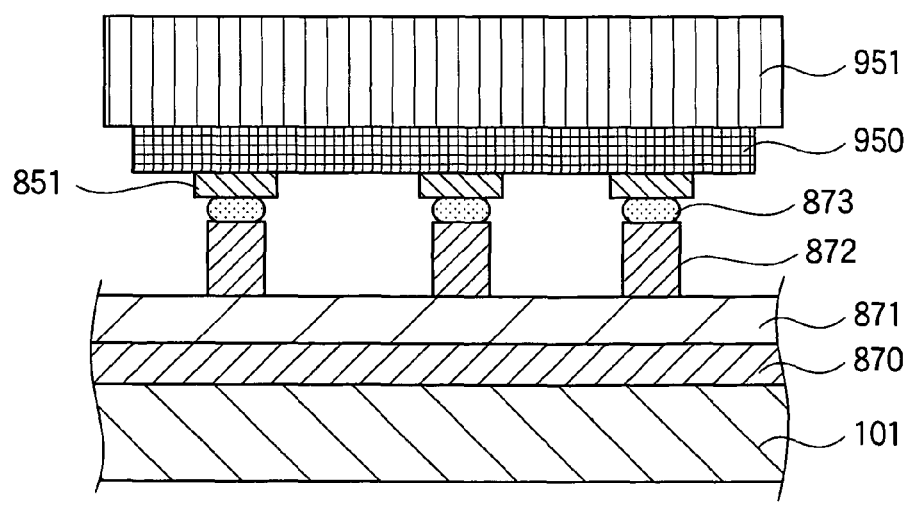
FIG. 20 illustrates a modification to the semiconductor composite apparatus according to the sixth embodiment.
Figure 21:
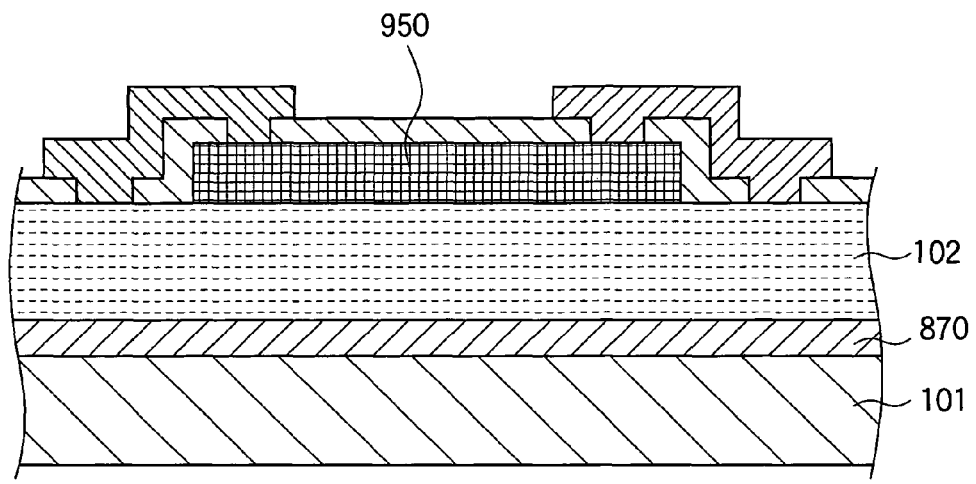
FIG. 21 illustrates another modification to the semiconductor composite apparatus according to the sixth embodiment.
Figure 22:
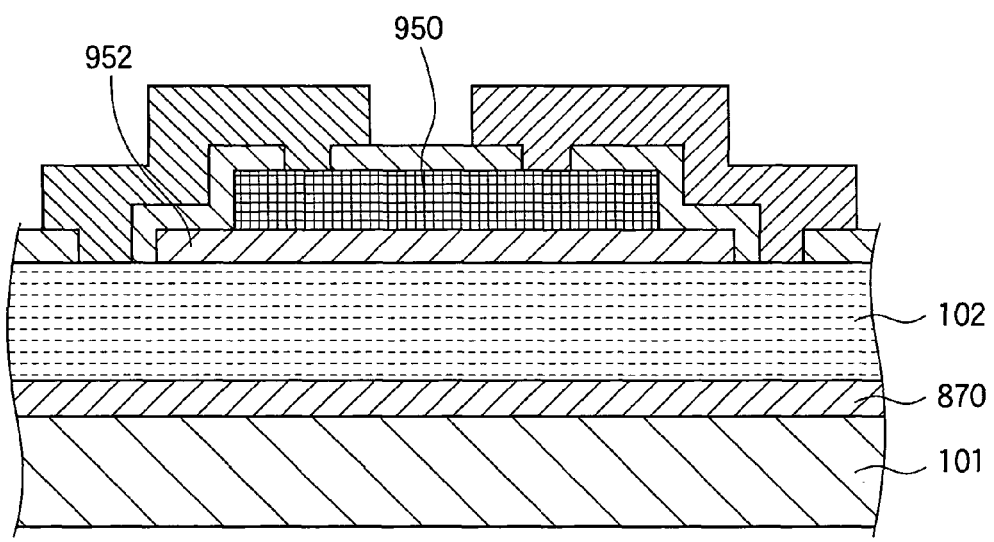
FIG. 22 illustrates a still another modification to the semiconductor composite apparatus according to the sixth embodiment.

FIG. 20 illustrates a modification to the semiconductor composite apparatus according to the sixth embodiment;

FIG. 21 illustrates another modification to the semiconductor composite apparatus according to the sixth embodiment;

FIG. 22 illustrates a still another modification to the semiconductor composite apparatus according to the sixth embodiment;

As shown in FIG. 20, a third substrate 951 may be provided on the upper surface of the third driving circuits 950. The third substrate 951 may be a sapphire substrate. The third substrate 951 having the third driving circuits 950 thereon is electrically connected to the first substrate 101 by flip chip bonding or a wire bonding.

The third substrate 951 strongly holds the third driving circuits 950 and provides good isolation between the third driving circuits 950 and the first substrate 101, thereby minimizing leakage current as well as improving the performance.

As shown in FIG. 21, the third driving circuits 950 in the form of a thin film may be bonded on the first driving circuits 102. Further, as shown in FIG. 22, the third driving circuits 950 in the form of a thin film may be provided on the first driving circuits 102 with a planarizing film 952 (dielectric film) formed between the third driving circuits 950 and first driving circuits 102, thereby saving the material cost of the first substrate 101 by a space required for third driving circuits 950.

Seventh Embodiment

A semiconductor composite apparatus according to a seventh embodiment differs from the fifth and sixth embodiments in that the third driving circuits are not used but a different configuration is employed. Elements similar to those in the fifth and sixth embodiments have been given the same reference numerals and their description is omitted.

Figure 23:
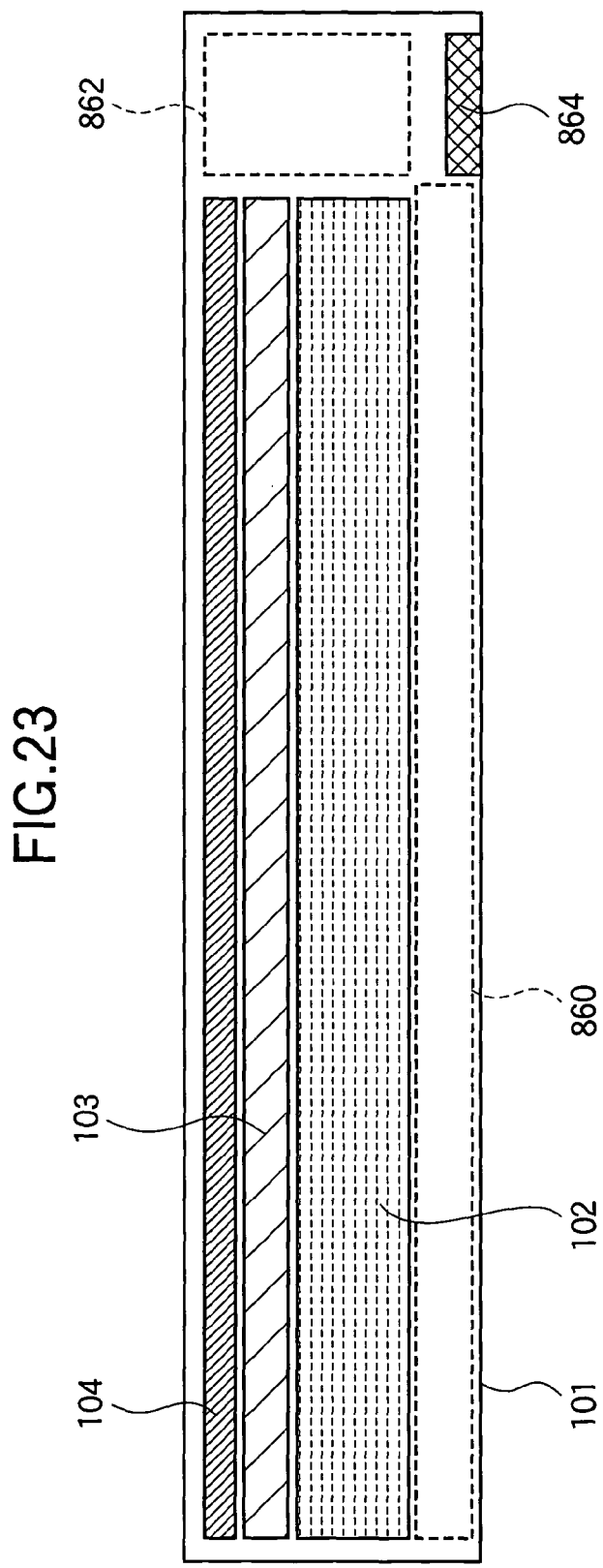
FIG. 23 is a top view of the semiconductor composite apparatus according to a seventh embodiment.
Figure 24:
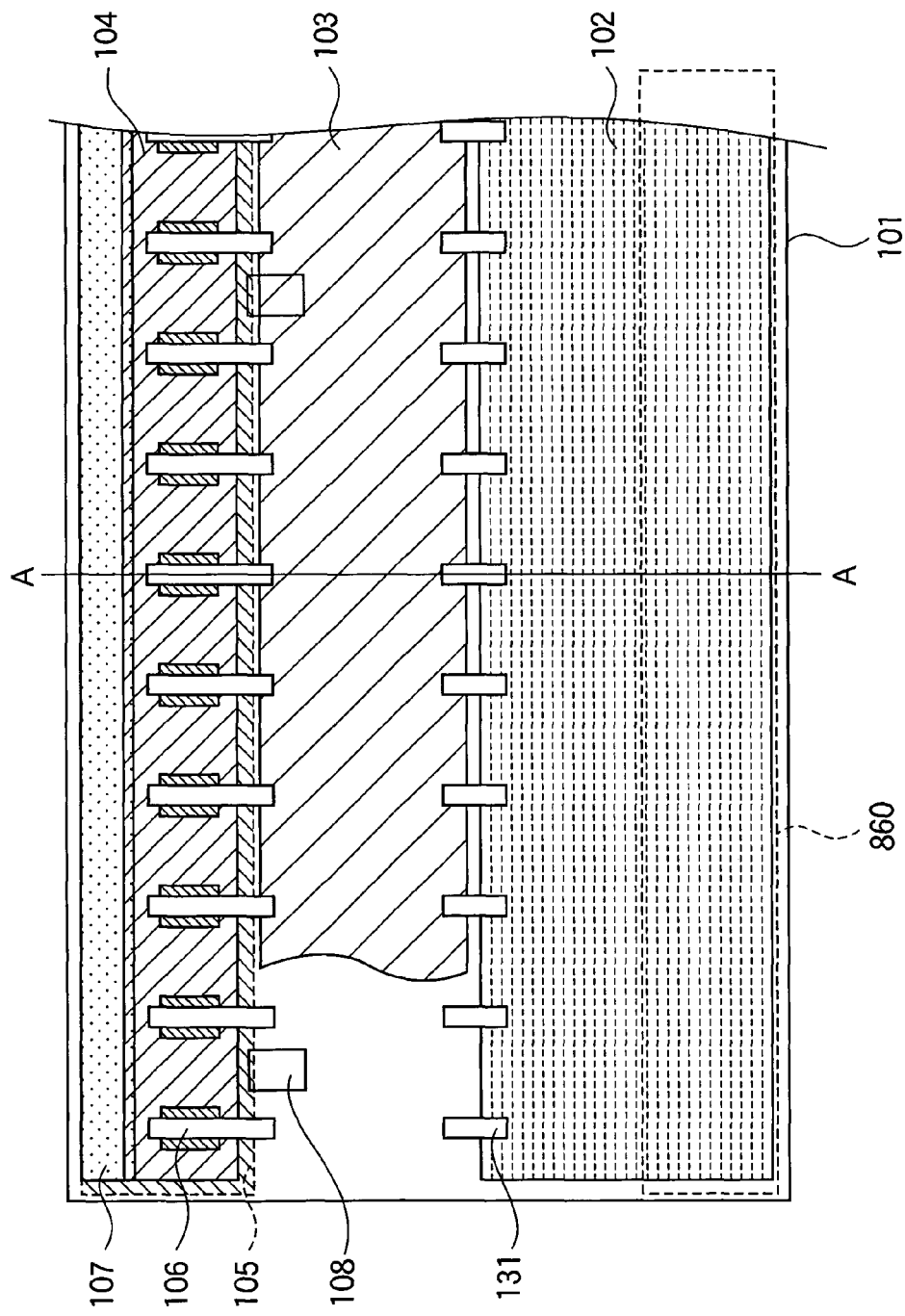
FIG. 24 is a top view illustrating a pertinent portion of the semiconductor composite apparatus.
Figure 25:
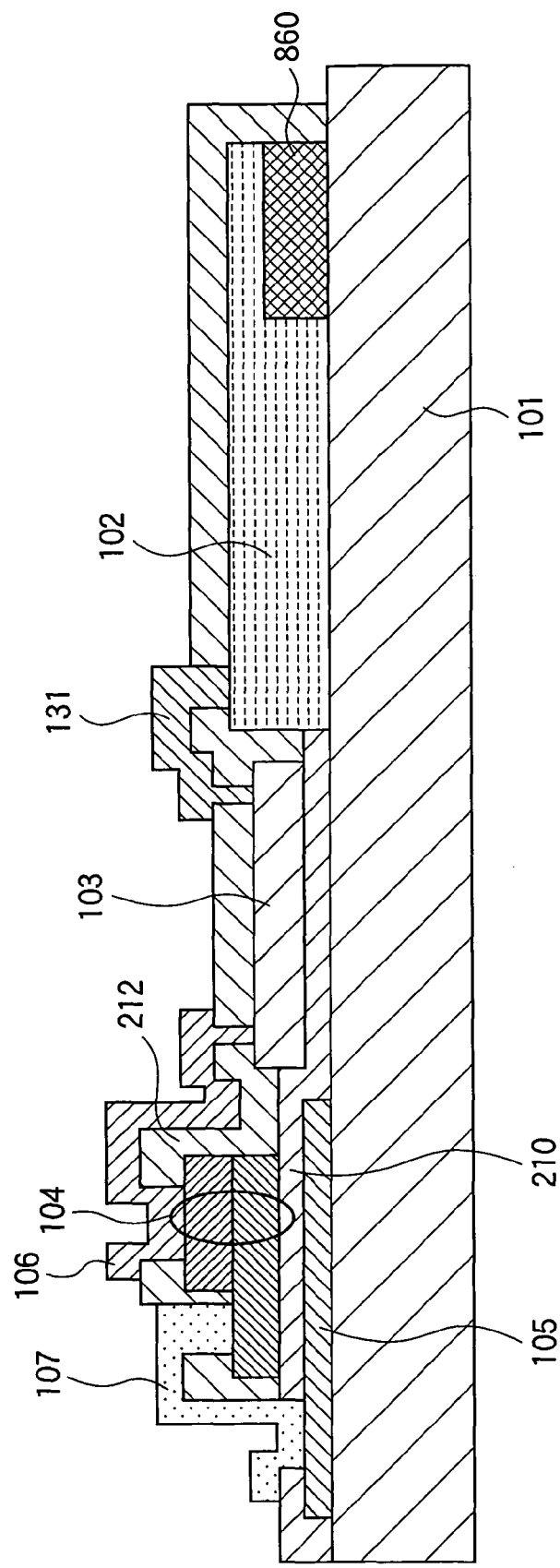
FIG. 25 is a cross sectional view take along a line A-A of FIG. 24.

FIG. 23 is a top view of the semiconductor composite apparatus. FIG. 24 is a top view illustrating a pertinent portion of the semiconductor composite apparatus. FIG. 25 is a cross sectional view taken along a line A-A of FIG. 24. While the semiconductor composite apparatus will be described in terms of the semiconductor thin film layer 104, first driving circuits 102, and second driving circuits 103 described in the first embodiment, the semiconductor thin film layer 104 may be replaced by the semiconductor thin film layers 304 and 404 previously mentioned in the first embodiment. Further, the first driving circuits 602 (third embodiment) may be replaced by the first driving circuits 102 and the second driving circuits 603 (third embodiment) may be replaced by the second driving circuits 103 (first embodiment) and 503 (second embodiment).

As shown in FIG. 23 and FIG. 24, the semiconductor composite apparatus according to the seventh embodiment does not employ the third driving circuits 850 and 950 described in the fifth and sixth embodiments but employs only wiring regions 860 and 862 formed on the first substrate 110. The semiconductor composite apparatus may be configured such that the first driving circuits 102 and the wiring region share an area. In other words, the wiring region 860 may be formed under the first driving circuits 102 as shown in FIG. 25. Thus, signals are communicated with external circuits through a connector 864, and electric power is received from the external circuits through the connector 864. The received signals are supplied to the first driving circuits 102. The electric power and the ground potential are supplied to the first driving circuits 102 and second driving circuits 103 through the wiring regions 860 and 862. Further, the signals are outputted to the external circuits from the first driving circuits 102 through the wiring regions 860 and 862.

Because the third drive circuits 850 and 950 are not provided on the semiconductor composite apparatus but on a separate substrate, the configuration of the semiconductor composite apparatus may be simplified as compared with a case in which the third driving circuits 850 and 950 are provided, thereby implementing a low cost semiconductor composite apparatus.

Figure 26:
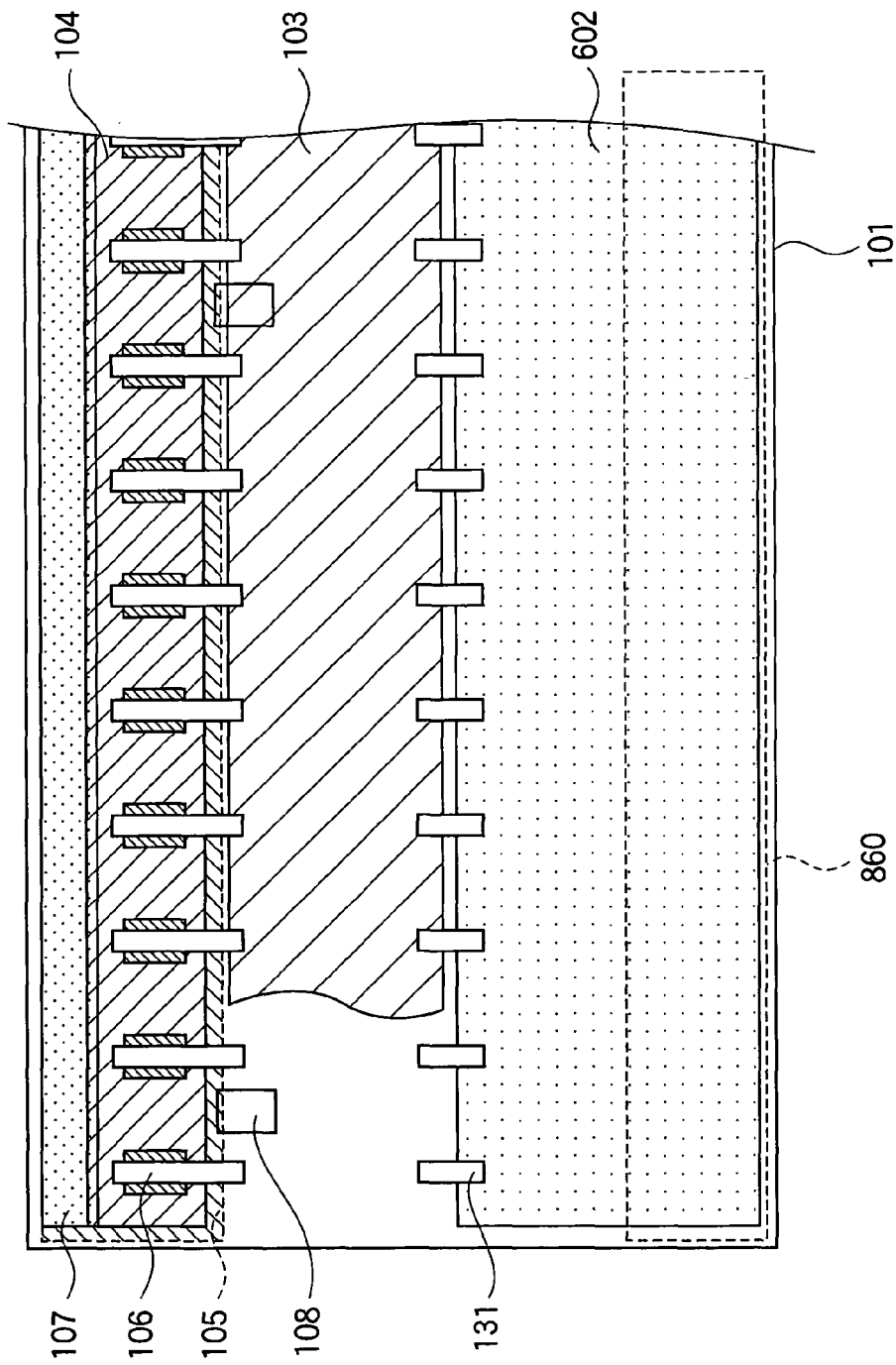
FIG. 26 illustrates a modification to the semiconductor composite apparatus according to the seventh embodiment.

FIG. 26 illustrates a modification to the semiconductor composite apparatus according to the seventh embodiment.

Referring to FIG. 26, instead of employing the first driving circuits 102 whose base material is a poly crystal Si, first driving circuits 602 whose base material is an organic semiconductor material described in the third embodiment may be employed though operating speed decreases. For such a semiconductor composite apparatus, a simple technique such as printing may be used in forming the first driving circuits 602 simultaneously, achieving a great cost reduction.

Figure 27:
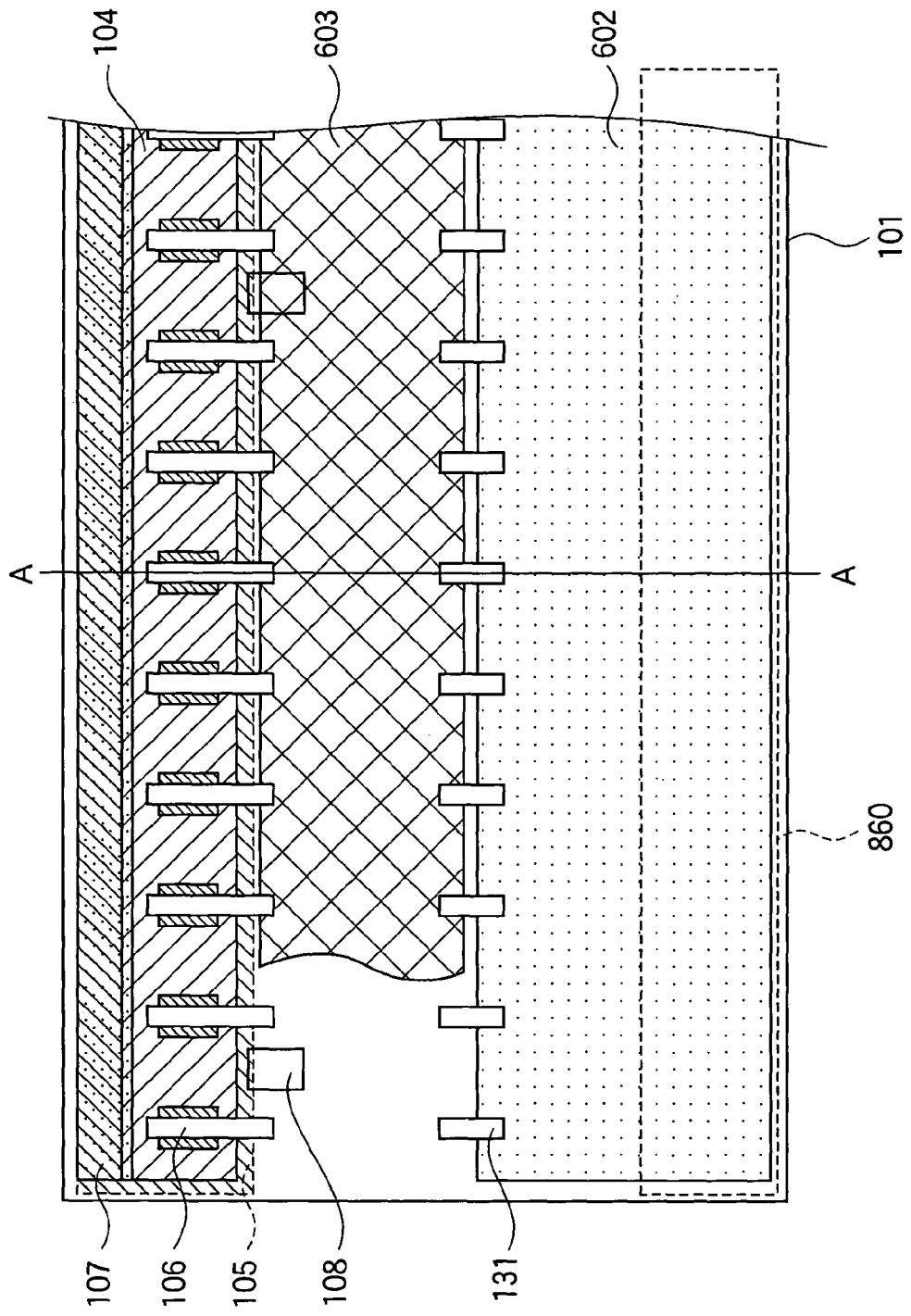
FIG. 27 illustrates a modification to the semiconductor composite apparatus according to the seventh embodiment.

FIG. 27 illustrates another modification to the semiconductor composite apparatus according to the seventh embodiment.

As shown in FIG. 27, instead of employing the second driving circuits 103 whose base material is a single crystal Si, the second driving circuits 603 whose base materials is a poly crystal Si described in the third embodiment may be used. For such a semiconductor composite apparatus, the second driving circuits 603 whose base material is a poly crystal Si can drive LEDs having a high light-emitting efficiency, saving the manufacturing cost greatly.

Figure 28:
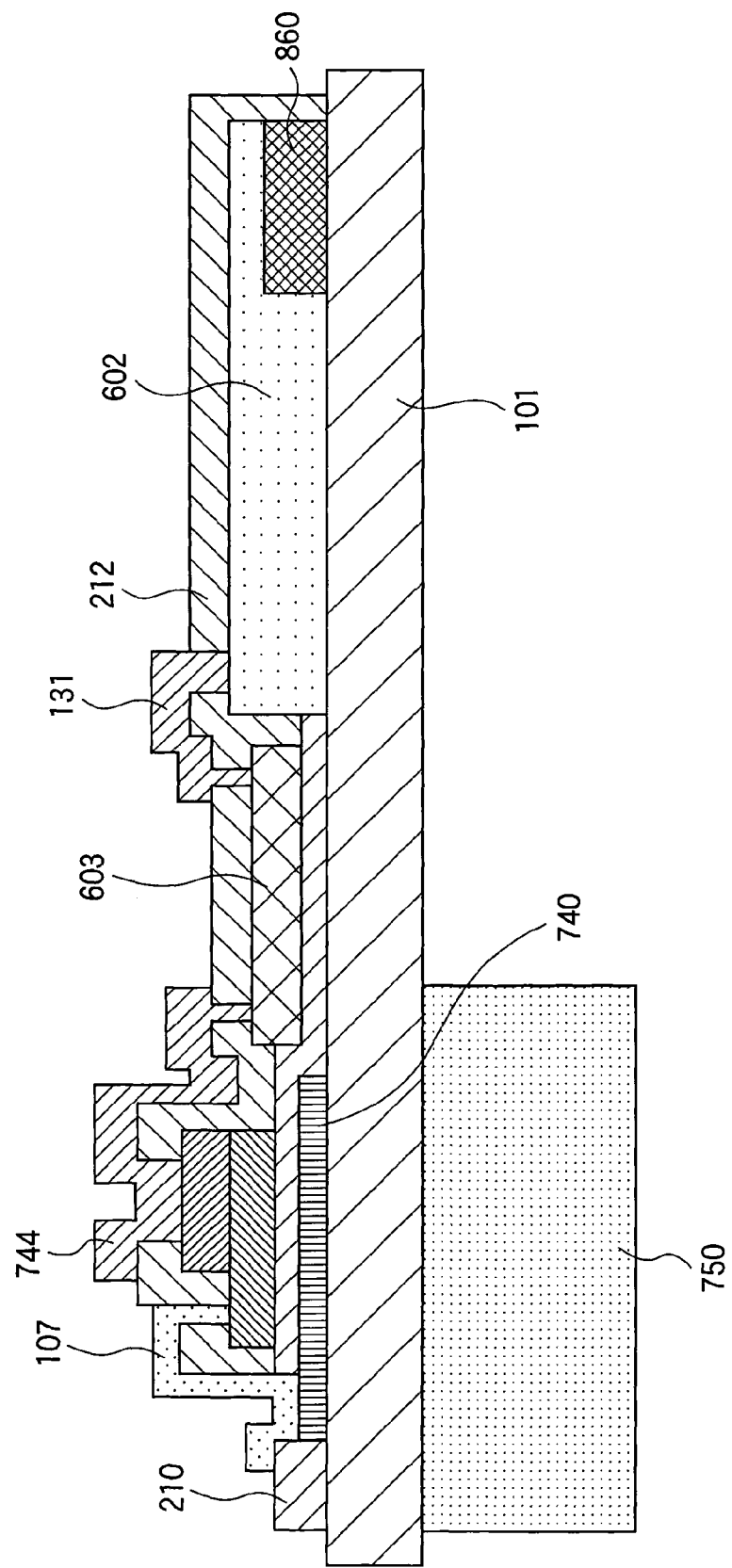
FIG. 28 illustrates a modification to the semiconductor composite apparatus according to the seventh embodiment.

FIG. 28 illustrates a still another modification to the semiconductor composite apparatus according to the seventh embodiment. The modification in FIG. 27 may further be modified as shown in FIG. 28. In other words, as shown in FIG. 28, the individual electrode 744 described in the fourth embodiment covers the semiconductor thin film 104. A transparent conductive film 740 is formed in place of the reflection layer 105. An optical lens 750 may also be provided on the side of the first substrate 101 remote from the LEDs, the optical lens 750 gathering the light emitted from the LEDs and focusing the light into small spots on the surface of an image bearing body of an image forming apparatus. The seventh embodiment allows configuring of a printhead in unitary construction with the optical lens, simplifying the assembly process.

Eighth Embodiment

A semiconductor composite apparatus according to an eighth embodiment differs from the fifth to seventh embodiments in that the connector and wiring region according to the fifth to seventh embodiments are fabricated on a second substrate. Elements similar to those in the fifth to seventh embodiments have been given the same reference numeral sand their description is omitted.

Figure 29:
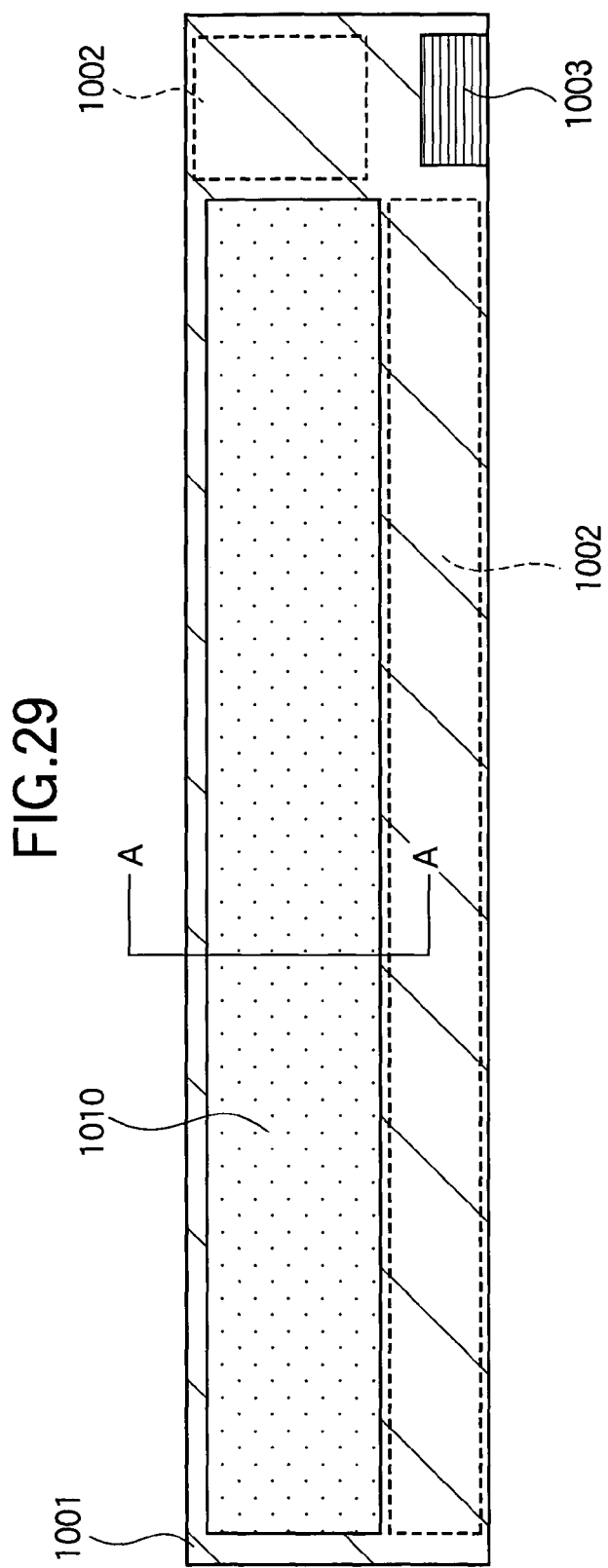
FIG. 29 is a top view of the semiconductor composite apparatus according to an eighth embodiment.
Figure 30:
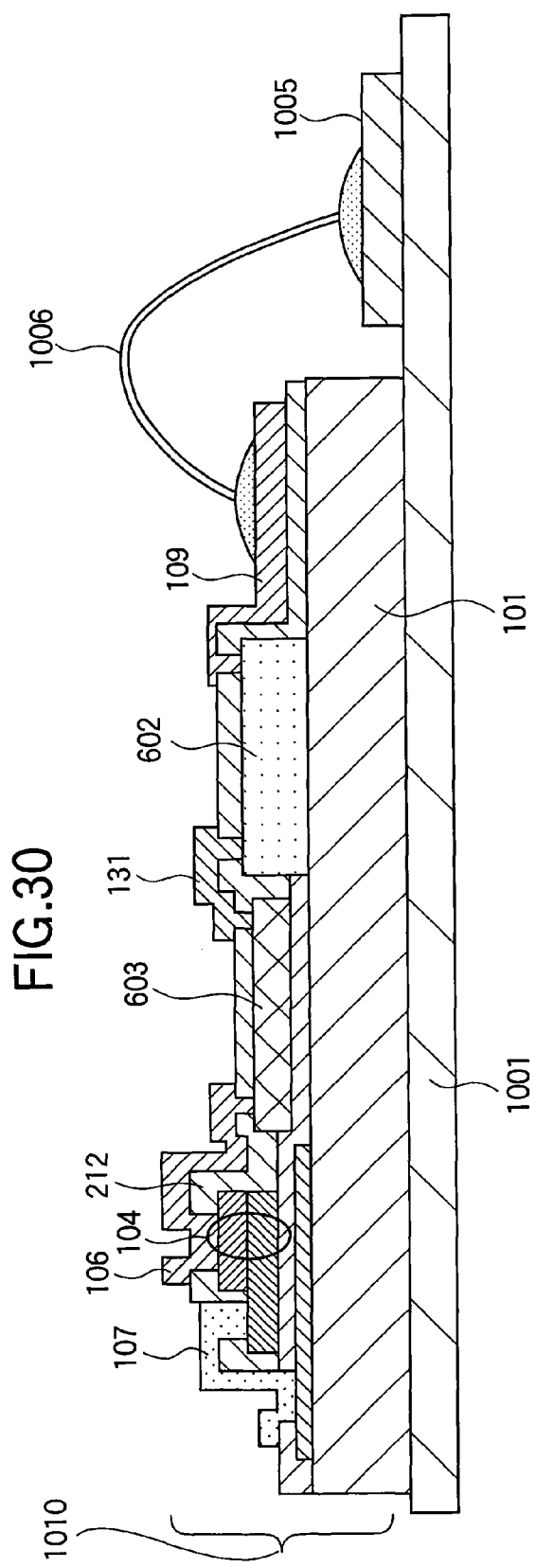
FIG. 30 is a cross sectional view taken along a line A-A.

FIG. 29 is a top view of the semiconductor composite apparatus. FIG. 30 is a cross sectional view taken along a line A-A. While the semiconductor composite apparatus will be described in terms of the semiconductor thin film layer 104, first driving circuits 602, and second driving circuits 603 described in the third embodiment, the semiconductor thin film layer 104 may be replaced by the semiconductor thin film layers 304 and 404 previously mentioned in the first embodiment. Further, the first driving circuits 602 may be replaced by the first driving circuits 102 (first embodiment) and the second driving circuits 603 may be replaced by the second driving circuits 103 and 503(second embodiment).

As shown in FIG. 29, the semiconductor composite apparatus according to the eighth embodiment employs a second substrate 1001 that includes the connector 864 and wiring regions 860 and 862 described in the fifth to seventh embodiments. Specifically, a second substrate 1001 has a wiring/electronic components region 1002 similar to the wiring regions 860 and 862, and a connector 1003 similar to the connector 864. The second substrate 1001 is a substrate formed of an inorganic material such as a glass substrate, a glass epoxy substrate, a ceramic substrate, or a plastics substrate.

A first substrate 101 is bonded on the second substrate 1001 by an adhesive as shown in FIG. 30, thus mounting a semiconductor composite apparatus 1010 (same configuration as that in FIG. 11) on the second substrate 1001. The connection pad 109 provided on the semiconductor composite apparatus 1010 is wire-bonded to the connection pad 1005 in the wiring/electronic components region 1002 on the second substrate 1001, thus establishing electrical connection between the semiconductor composite apparatus and the second substrate 1001. In other words, the signals and electric power can be relayed through the second substrate 1001.

The signals received through the connector 1003 from external circuits are supplied to the first driving circuits 602 via the wiring/electronic components region 1002. Also, electric power and the ground potential are supplied to the first driving circuits 602 and second driving circuits 603 via the wiring/electronic components region 1002. Further, the first driving circuits 602 can output signals to the external circuits via the wiring/electronic components region 1002.

As described above, the second substrate 1001 provided with a connector and a wiring structure fabricated thereon allows smooth communication of signals between the semiconductor composite apparatus and the external circuits, and permits supplying of electric power from the external circuits to the semiconductor composite apparatus. The eighth embodiment is effective in implementing the first substrate 101 having a narrower width, ensuring reduction of the manufacturing cost. The eighth embodiment offers more degrees of freedom, for example, multi-layer wires, in the basic design of the semiconductor composite apparatus.

Ninth Embodiment

A ninth embodiment differs from the eighth embodiment in that a semiconductor composite apparatus is mounted on the second substrate in a different way. Elements similar to those in the eighth embodiment have been given the same reference numerals and their description is omitted.

Figure 31:
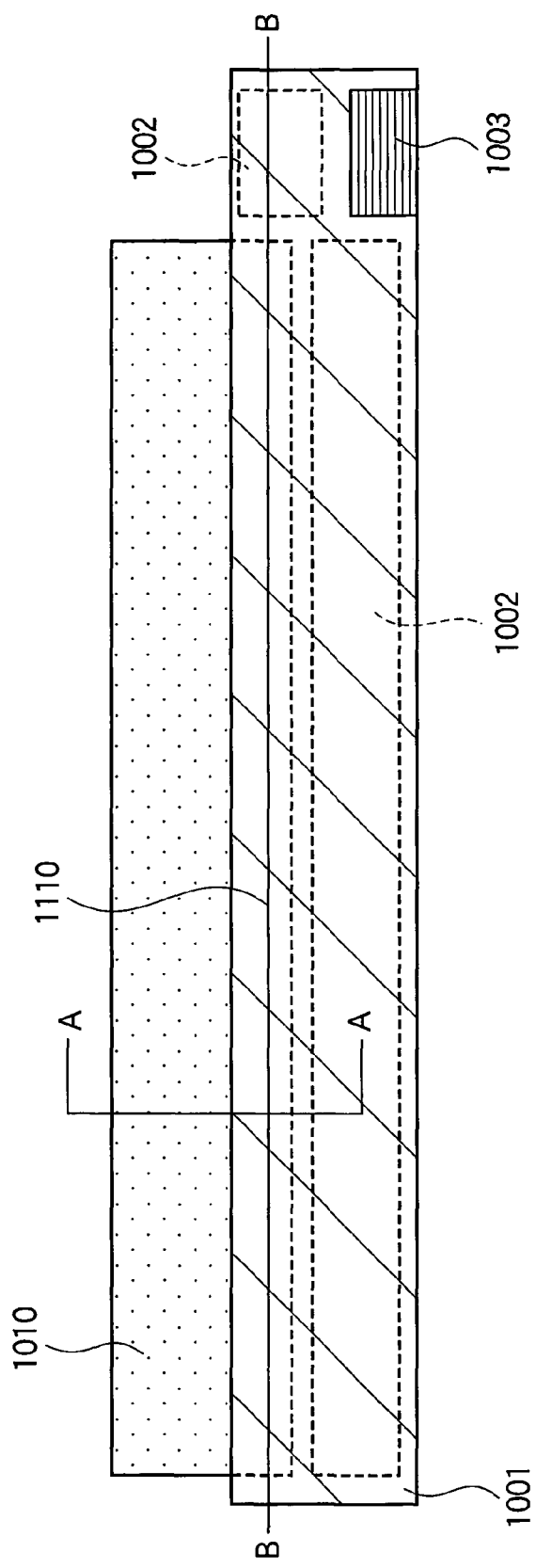
FIG. 31 is a top view of a semiconductor composite apparatus according to a ninth embodiment.
Figure 32:
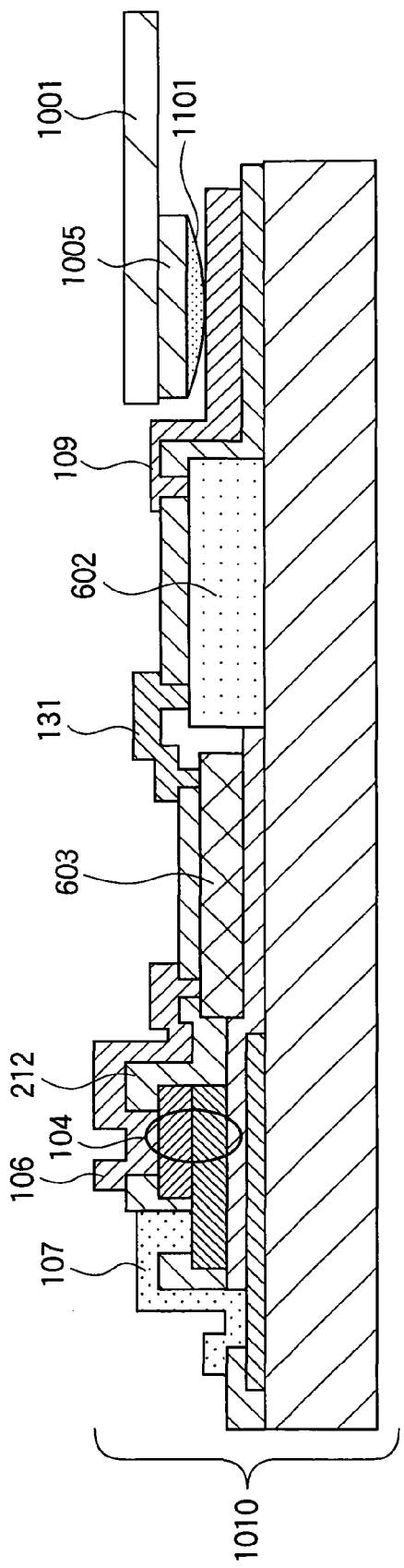
FIG. 32 is a cross sectional view taken along a line A-A of FIG. 31.
Figure 33:
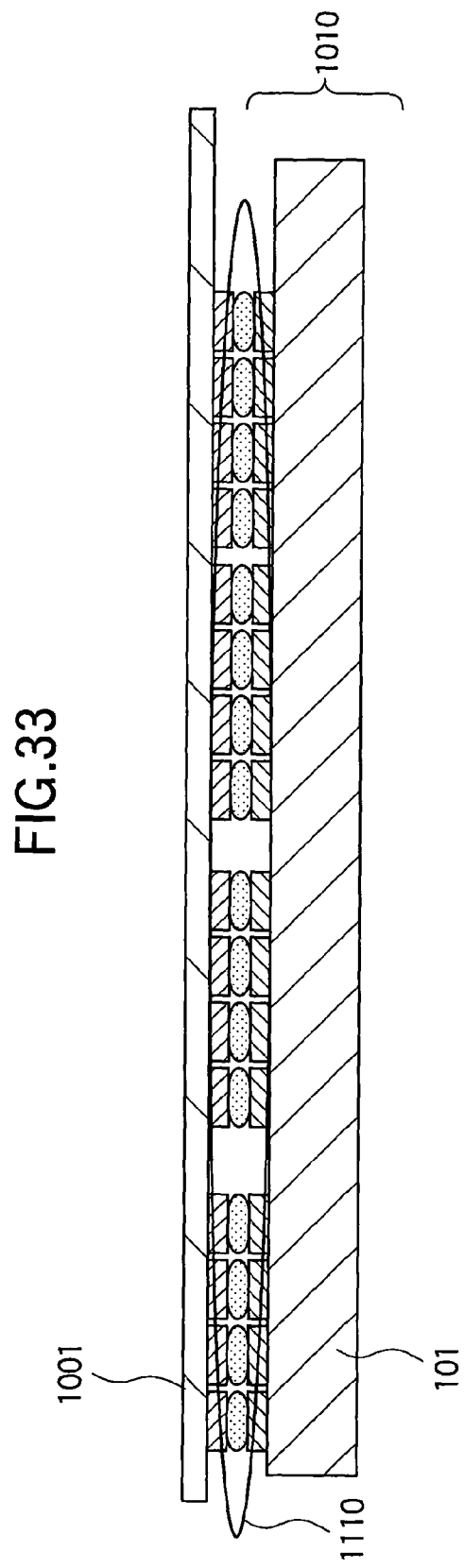
FIG. 33 is a cross sectional view taken along a line B-B of FIG. 31.

FIG. 31 is a top view of a semiconductor composite apparatus according to the ninth embodiment. FIG. 32 is a cross sectional view taken along a line A-A of FIG. 31. FIG. 33 is a cross sectional view taken along a line B-B of FIG. 31. While the semiconductor composite apparatus will be described in terms of the semiconductor thin film layer 104, first driving circuits 602, and second driving circuits 603 described in the third embodiment, the semiconductor thin film layer 104 may be replaced by the semiconductor thin film layers 304 and 404 previously mentioned in the first embodiment. Further, the first driving circuits 602 may be replaced by the first driving circuits 102 (first embodiment) and the second driving circuits 603 (third embodiment) may be replaced by the second driving circuits 103 (first embodiment) and 503 (second embodiment).

In the eighth embodiment, a first substrate 101 is bonded on a second substrate 1001 by an adhesive, thus mounting a semiconductor composite apparatus 1010 on the second substrate 1001. In the ninth embodiment, the first substrate 101 is electrically connected to the second substrate 1001 having a connector and wires formed thereon.

Specifically, as shown in FIG. 32 and FIG. 33, a connection pad 109 on the semiconductor composite apparatus 1010 is positioned relative to a connection pad 1005 on a wiring/electronic component region 1002 formed on the second substrate 1001. Then, the connection pad 1005 is electrically connected to the connection pad 109 either directly or by means of a bonding paste layer 1101, thus bonding the second substrate 1001 on the semiconductor composite apparatus 1010 throughout a connection region 1110 as shown in FIG. 31. The second substrate 1001 may be fixed by using, for example, a UV curing resin after the second substrate 1001 is connected to the semiconductor apparatus 1010.

The ninth embodiment is more effective in implementing a narrow-width semiconductor composite apparatus than the eighth embodiment. Further, the width of the second substrate 1001 in the ninth embodiment can be narrower than the width of the first substrate 101.

Figure 34:
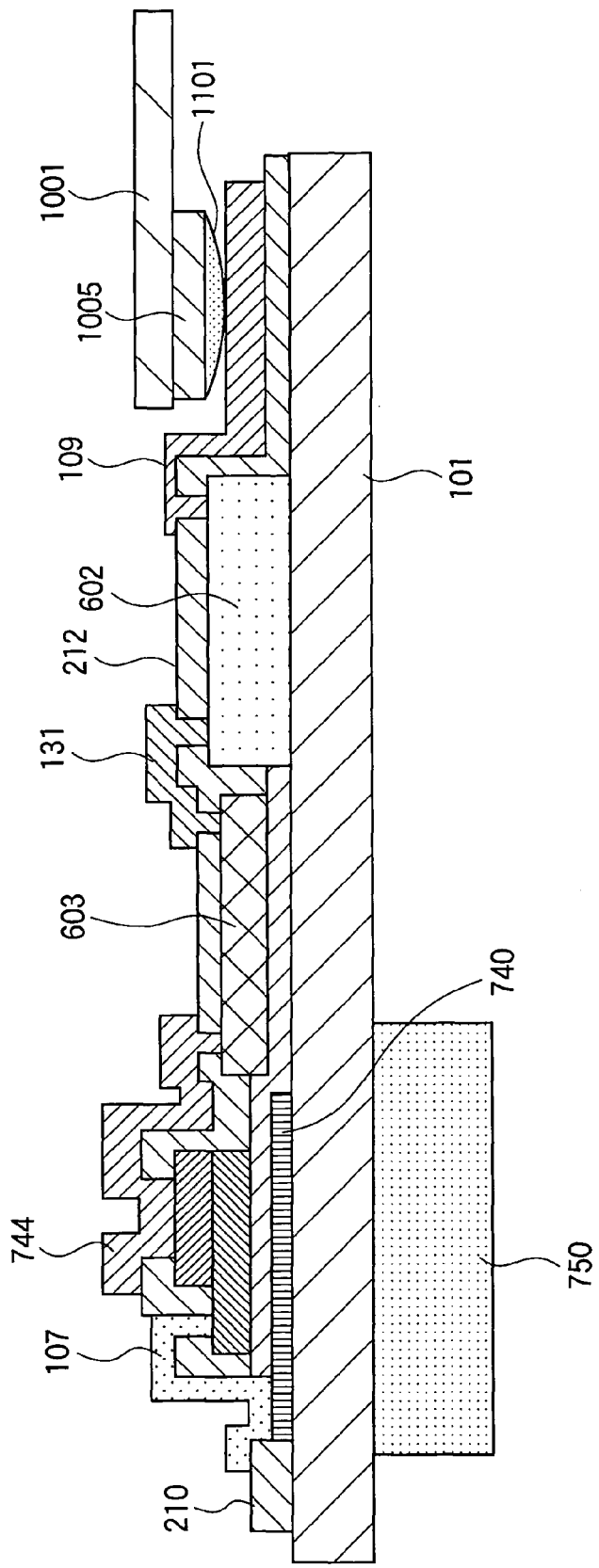
FIG. 34 illustrates a modification to the ninth embodiment according to the ninth embodiment.
Figure 35:
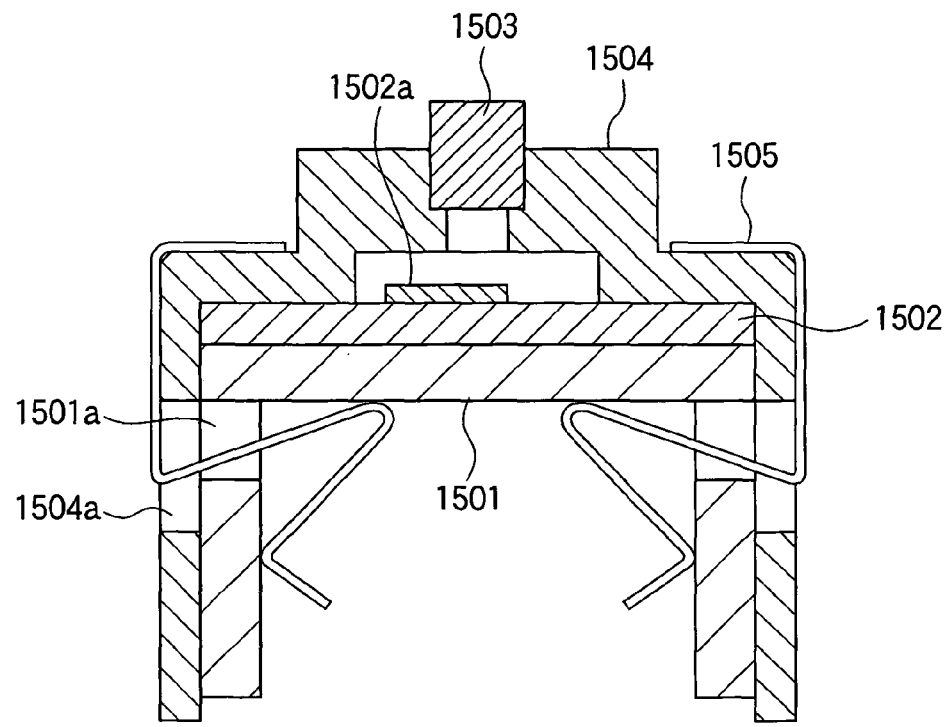
FIG. 35 is a cross section illustrating the configuration of an LED printhead according to a tenth embodiment.

The semiconductor composite apparatus may be modified as follows: Referring to FIG. 34, the individual electrodes 744 described in the fourth embodiment is used to cover the upper surface of the semiconductor thin film 104. The transparent conductive film 740 described in the fourth embodiment is formed. An optical lens 750 is provided on the side of the first substrate 101 remote from the LEDs, gathering light emitted from the LEDs and focusing the light into small spots on an image forming surface of a photoconductive drum of an image forming apparatus. The first substrate 101 with the optical lens 750 provided thereon may be electrically connected onto the second substrate 1001.

Tenth Embodiment

A tenth embodiment is directed to an LED printhead to which the semiconductor composite apparatuses according to the first to third embodiments and the fifth to eighth embodiments are applied.

The LED printhead according to the tenth embodiment is used as an exposing unit for use in, for example, an electrophotographic printer or an electrophotographic copying machine. Specifically, the LED printhead includes an LED unit 1502 carries LEDs thereon and is supported on a base member 1501. The LED unit 1502 includes semiconductor composite apparatus according to the first to third embodiments and the fifth to eighth embodiments is mounted on a substrate. A rod lens array 1503 is disposed above the LEDs of a light emitting unit 1502a. The rod lens array 1503 includes a plurality of cylindrical optical lenses aligned side by side along a straight line of LEDs. The cylindrical optical lenses are supported on a lens holder 1504. The LEDs of the light emitting unit 1502a can be any one of the semiconductor thin film layers 104, 304, and 404.

The lens holder 1504 covers the base member 1501 and LED unit 1502. The base member 1501, LED unit 1502, and lens holder 1504 are held together in a sandwiched relation by means of clampers 1505, which extend through openings 1501a formed in the base member 1501 and through openings 1504a formed in the lens holder 1504. In other words, the base member 1501 and the lens holder 1504 serve as a supporting frame that supports the LED unit 1502 and the rod lens array 1503.

The rod lens array 1503 gathers light emitted from the LED unit 1502 and focuses the light into small spots on an external member (e.g., photoconductive drum).

Because the LED unit 1502 employs the semiconductor composite apparatus according to the first to third embodiments and the fifth to eighth embodiments, the LED unit 1502 can be miniaturized and provides high quality images. Because the driving circuits for the LEDs may be divided in terms of required functions, the manufacturing cost may be partially reduced according to the specifications of the respective driving circuits, implementing excellent performance of the LED unit 1502 at low cost.

Eleventh Embodiment

An LED printhead according to an eleventh embodiment is directed to an LED print head to which the semiconductor composite apparatus according to the ninth embodiment is applied.

Figure 36:
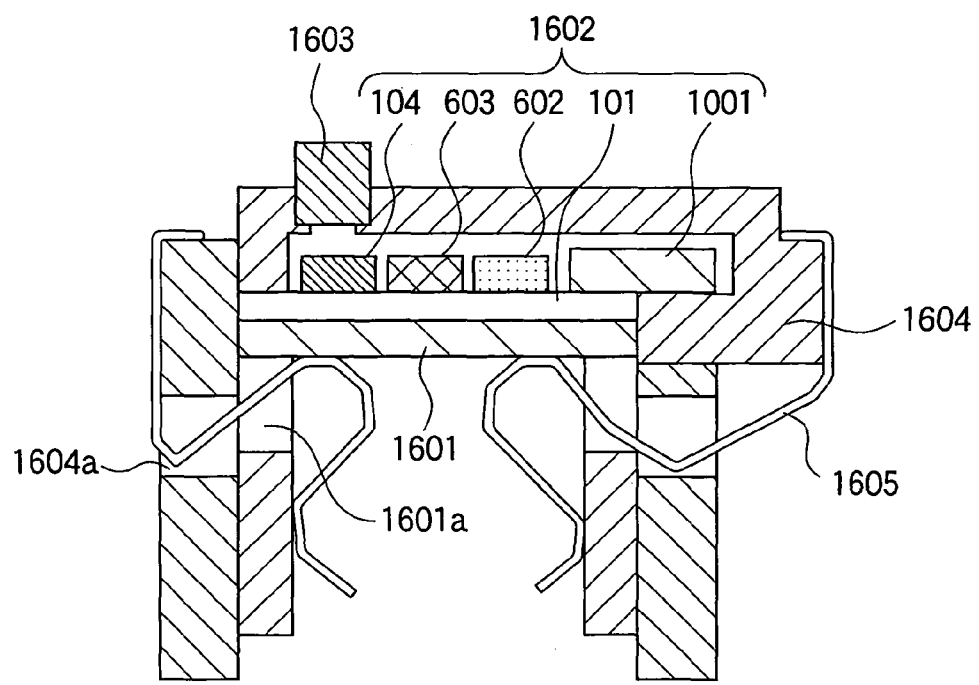
FIG. 36 is a cross section illustrating the configuration of an LED printhead according to an eleventh embodiment.

The LED printhead according to the eleventh embodiment is used as an exposing unit for use in, for example, an electrophotographic printer or an electrophotographic copying machine. Specifically, as shown in FIG. 36, the LED printhead includes an LED unit 1602 carries LEDs thereon and is supported on a base member 1601. The first substrate 101 is fixed on the base member 1601, thus mounting the semiconductor composite apparatus according to the ninth embodiment. A rod lens array 1603 is disposed above the LEDs formed of any one of the semiconductor thin films 104, 304, and 404. The rod lens array 1603 gathers light emitted from the LEDs and focuses the light into small spots. The rod lens array 1603 includes a plurality of cylindrical optical lenses aligned side by side along a straight line of LEDs. The cylindrical optical lenses are supported on a lens holder 1604.

The lens holder 1604 covers the base member 1601 and LED unit 1602. The base member 1601, LED unit 1602, and lens holder 1604 are held together in a sandwiched relation by means of clampers 1605, which extend through openings 1601a formed in the base member 1601 and through openings 1604a formed in the lens holder 1604. In other words, the base member 1601 and the lens holder 1604 serve as a supporting frame that supports the LED unit 1602 and the rod lens array 1603.

Because the LED unit 1602 employs the semiconductor composite apparatus according to the ninth embodiment, the reliability of the wiring region can be greatly improved.

Twelfth Embodiment

A twelfth embodiment is directed to an LED printhead having an optical lens which is a modification to the fourth and seventh embodiments or an LED printhead having an optical lens which is a modification to the ninth embodiment.

Figure 37:
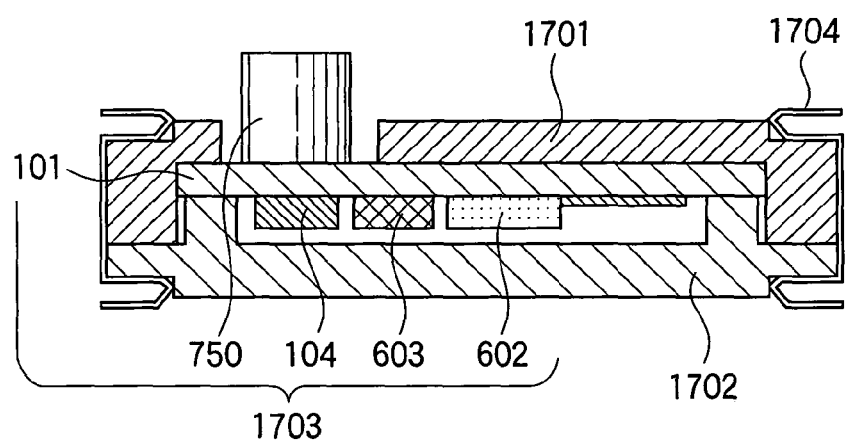
FIG. 37 is a cross section illustrating the configuration of an LED printhead according to a twelfth embodiment.

The LED printhead according to the twelfth embodiment is used as an exposing unit for use in, for example, an electrophotographic printer or an electrophotographic copying machine. Specifically, as shown in FIG. 37, the LED printhead includes an LED unit 1703 that carries LEDs thereon, and is supported on supporting frames 1701 and 1702. The first substrate 101 is supported by the supporting frames 1701 and 1702. Fixing pins 1704 hold the supporting frames 1701 and 1702 together, so that the semiconductor composite apparatus having the optical lens 750 is mounted on the LED unit.

Because the LED unit 1703 uses the semiconductor composite apparatus having the optical lens 750, a lens holder for supporting a rod lens array is not necessary as opposed to the tenth embodiment of the eleventh embodiment. This makes it easy to assemble the LED unit, and offers a miniaturized and simplified structure of the LED unit. Heat dissipating fins, not shown, may be provided to the supporting frames 1701 and 1702 as required.

Thirteenth Embodiment

A thirteenth embodiment is directed to an image forming apparatus that employs an LED printhead to which any one of the tenth to twelfth embodiments is applied.

Figure 38:
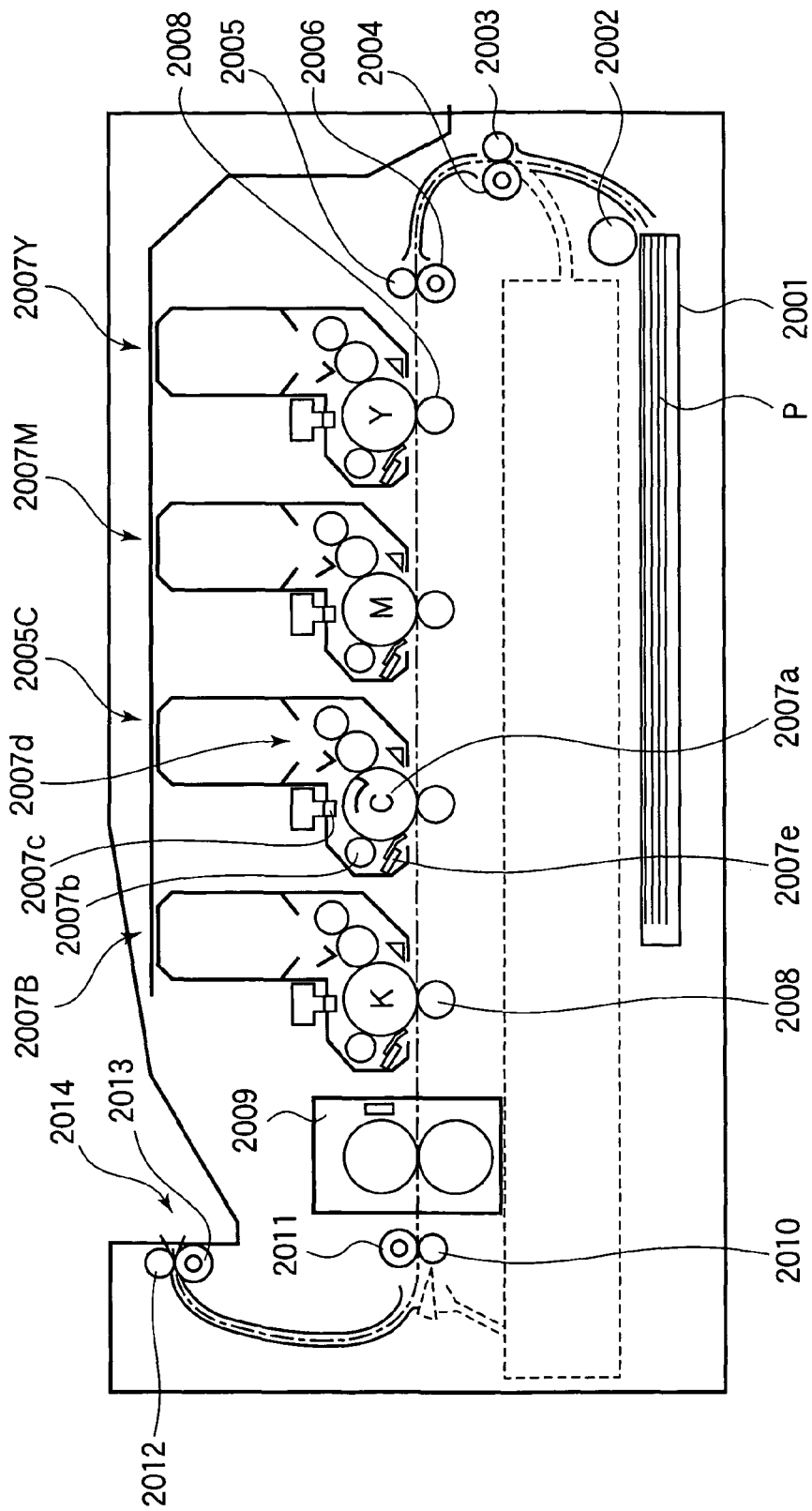
FIG. 38 is a cross section illustrating the configuration of an LED printhead according to a thirteenth embodiment.

Referring to FIG. 38, the image forming apparatus includes a paper cassette 2001 that holds a stack of non-printed recording medium P. A hopping roller 2002 contacts the top page of the stack of the recording medium P. When the hopping roller 2002 rotates, the hopping roller 2002 feeds the top page of the stack of recording medium P into a transport path. A pinch roller 2003, registration roller 2004, pinch 2005, and registration roller 2006 cooperate with one another to feed the page of the recording medium P to the process unit 2007Y in timed relation with image formation performed in the process unit 2007Y. Then, the page of the recording medium P is advanced through the process units 2007M, 2007C, and 2007B.

The process units 2007Y, 2007M, 2007C, and 2007B are aligned from upstream to downstream of the direction of travel of the recording medium P. Each of the process units 2007Y, 2007M, 2007C, and 2007B may be substantially identical; for simplicity only the operation of the process units 2007Y for forming yellow images will be described, it being understood that the other process units may work in a similar fashion.

The process unit 2007Y includes a photoconductive drum 2007*a* that is driven in rotation by a drive source and gears, not shown, in such a direction as to transport the recording medium P to the adjacent process unit. Disposed around the photoconductive drum 2007*a* are a charging unit 2007*b*, an exposing unit 2007*c*, a developing unit 2007*d*, and a cleaning unit 2007*e*. The charging unit 2007*b* charges the surface of the photoconductive drum 2007*a*. The exposing unit 2007*c* selectively energizes LEDs, not shown, in accordance with print data to illuminate the charged surface of the photoconductive drum 2007*a* to form an electrostatic latent image on the photoconductive drum 2007*a*. The developing unit 2007*d* supplies yellow toner to the electrostatic latent image on the photoconductive drum 2007*a* to develop the electrostatic latent image into a yellow toner image. The cleaning unit 2007*e* removes residual toner from the photoconductive drum 2007*a*.

A transfer roller 2008 is formed of, for example, a semiconductive rubber and opposes the photoconductive drum 2007*a*. A voltage is applied to the transfer roller 2008 to create a potential difference between the photoconductive drum 2007*a* and the transfer roller 2008, thereby transferring the toner image onto the recording medium P.

A fixing unit 2009 is located downstream of the process unit 2007B, and includes a heat roller and a pressure roller that form a fixing point between the heat roller and pressure roller. When the recording medium P passes through the fixing point, the toner images of the respective colors are fused under pressure and heat into a permanent full color image.

The recording medium P is advanced at a predetermined speed through the process units in sequence, so that toner images of the respective colors are transferred onto the recording medium P one over the other in registration.

A pinch roller 2010, discharge roller 2011, pinch roller 2012, and discharge roller 2013 are driven in rotation by a drive source, not shown, to discharge the recording medium P through the discharge path onto a stacker 2014.

In this manner, a full color image is formed on the recording medium P.

As described above, because the image forming apparatus employs an LED print head according to the tenth to twelfth embodiments, the image forming apparatus is good in space utilization efficiency, high quality image formation, and reduction of the manufacturing cost.

The present invention is not limited to the aforementioned embodiments. For example, the embodiments have been described in terms of a semiconductor composite apparatus that can be applied to an LED printhead. However, the present invention may be applicable to anything provided that arbitrary active devices are controllably driven. The present invention may also be applied to arbitrary light emitting elements, for example, a semiconductor laser.

The conductivity type of the semiconductor thin film layer in the present invention may be changed from an n-type a p-type and vice versa. Also, the conductivity type of the active layer may be changed in a variety of forms such as n-type, p-type, and non-doped.

While the first semiconductor materials for forming the semiconductor thin film in the embodiments have been described with respect to GaAs, AlGaAs, and AlGaAsP, the first semiconductor materials may contain one nitride semiconductor material such as $GaAs_{1-x}N_x$, $GaP_{1-x}N_x$, $InAs_{1-x}N_x$, $InP_{1-x}N_x$, $InGa_{1-x}As_{1-y}N_y$, $InP_{1-x-y}As_xN_y$, $GaP_{1-x-y}As_xN_y$, $In_xGa_{1-x}N$, $Al_xGa_{1-x}N$, $In_xAl_{1-x}N$, or GaN ($1 \geq x \geq 0, 1 \geq y \geq 0$), or more than one of these materials.

The LEDs have been described with respect to a double hetero junction, the present invention may also be of other structure such as a single hetero junction or a homo junction.

While the semiconductor thin films have been described with respect to an LED epitaxial film, the present invention may be applied to arbitrary light emitting elements. For example, the light emitting elements may be replaced by light receiving elements.

The LED printhead and image forming apparatus are not limited to FIGS. 35-38.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor composite apparatus, comprising:
  a first substrate having first and second elongated outer regions and an elongated intermediate region between said first and second outer regions;
  a semiconductor thin film layer disposed above said second outer region of said first substrate and comprising a first semiconductor material;
  light emitting elements formed in said semiconductor thin film layer;
  first driving circuits disposed above said first outer region of said first substrate, said first driving circuits comprising logic circuits that are fabricated on polycrystalline silicon material, that receive input signals from external circuitry, and that generate drive signals based on the input signals, said first driving circuits having a predetermined thickness;

connection pads disposed above said first outer region of said first substrate, adjacent said first driving circuits;

wiring conductors connecting said connection pads to said first drive circuits, said wiring conductors having a thickness that is smaller than the thickness of said first driving circuits;

second driving circuits disposed above said intermediate region of said first substrate, said second driving circuits comprising single crystal silicon material;

drive signal wiring means for connecting said first driving circuits to said second driving circuits to convey said drive signals to said second driving circuits; and drive power wiring means for connecting said second driving circuits to said light emitting elements to supply drive power to said light emitting elements.

2. The semiconductor composite apparatus according to claim 1, wherein said second driving circuits supply the drive power to drive said light emitting elements at a first speed; and wherein said first driving circuits control said second driving circuits to operate at a second speed that is lower than the first speed.

3. The semiconductor composite apparatus according to claim 1, wherein said first substrate is formed of a material optically transparent to a wavelength of light emitted from the light emitting elements.

4. The semiconductor composite apparatus according to claim 3, further comprising a rod lens array that gathers the light generated by light emitting elements, the rod lens array having a focal distance substantially equal to a thickness of said first substrate.

* * * * *